(12) United States Patent
Kageyama et al.

(10) Patent No.: US 11,655,947 B2
(45) Date of Patent: May 23, 2023

(54) LIGHT EMITTING DEVICE, LIGHT EMITTING MODULE, AND METHOD OF MANUFACTURING LIGHT EMITTING MODULE

(71) Applicant: NICHIA CORPORATION, Anan (JP)

(72) Inventors: Hiroaki Kageyama, Tokushima (JP); Takashi Ishii, Tokushima (JP)

(73) Assignee: NICHIA CORPORATION, Anan (JP)

( * ) Notice: Subject to any disclaimer, the term of this patent is extended or adjusted under 35 U.S.C. 154(b) by 121 days.

(21) Appl. No.: 17/224,816

(22) Filed: Apr. 7, 2021

(65) Prior Publication Data

US 2021/0317958 A1    Oct. 14, 2021

(30) Foreign Application Priority Data

Apr. 8, 2020   (JP) .............................. JP2020-069883
Sep. 25, 2020  (JP) .............................. JP2020-161124

(51) Int. Cl.
*F21S 4/28*       (2016.01)
*F21K 9/90*       (2016.01)
*F21V 29/503*     (2015.01)
*F21V 23/00*      (2015.01)
(Continued)

(52) U.S. Cl.
CPC .................. *F21S 4/28* (2016.01); *F21K 9/90* (2013.01); *F21V 23/002* (2013.01);
(Continued)

(58) Field of Classification Search
CPC ....... H01L 33/10; H01L 33/405; H01L 33/42; H01L 33/44; H01L 33/50; H01L 33/58;
(Continued)

(56) References Cited

U.S. PATENT DOCUMENTS 6,271,469 B1   8/2001   Ma et al.
8,704,265 B2 * 4/2014   Seo .......................... H05B 45/20
                                                    257/E33.059

(Continued)

FOREIGN PATENT DOCUMENTS

JP    2006-165058 A    6/2006
JP    2009-026846 A    2/2009
(Continued)

*Primary Examiner* — Allen L Parker
*Assistant Examiner* — David W Houston, III
(74) *Attorney, Agent, or Firm* — Foley & Lardner LLP

(57) ABSTRACT

A light emitting device includes: a plurality of element structural bodies, each including: a substrate, a light emitting element mounted on or above the substrate, and a light-transmissive member disposed on or above the light emitting element, wherein at least three of the plurality of element structural bodies are disposed along a first direction; a first covering member that covers lateral surfaces of the substrate, the light emitting element, and the light-transmissive member of each of the plurality of element structural bodies; and a support member that covers a lateral surface of the first covering member, wherein at least a portion of the support member is disposed lateral to the plurality of element structural bodies and extends along the first direction. A rigidity of the support member is greater than a rigidity of the first covering member.

18 Claims, 33 Drawing Sheets

(51) Int. Cl.
 *H01L 23/00* (2006.01)
 *H01L 25/00* (2006.01)
 *H01L 33/00* (2010.01)
 *F21Y 115/10* (2016.01)
 *F21Y 103/10* (2016.01)

(52) U.S. Cl.
 CPC ............ *F21V 29/503* (2015.01); *H01L 24/00* (2013.01); *H01L 25/00* (2013.01); *H01L 33/00* (2013.01); *F21Y 2103/10* (2016.08); *F21Y 2115/10* (2016.08)

(58) Field of Classification Search
 CPC ......... H01L 24/00; H01L 25/00; H01L 33/00; F21S 4/28; F21V 29/503; F21V 23/002; F21K 9/90; F21Y 2103/10; F21Y 2115/10
 USPC .......................................................... 257/98
 See application file for complete search history.

(56) References Cited

U.S. PATENT DOCUMENTS

| | | | |
|---|---|---|---|
| 2007/0001188 A1* | 1/2007 | Lee | H01L 25/0753 257/E33.059 |
| 2015/0167938 A1 | 6/2015 | Groetsch et al. | |
| 2015/0380622 A1 | 12/2015 | Miyoshi et al. | |
| 2016/0146435 A1* | 5/2016 | Son | F21K 9/00 362/249.14 |
| 2016/0190380 A1* | 6/2016 | Luan | H01L 31/02002 257/82 |
| 2017/0179360 A1 | 6/2017 | Miyoshi et al. | |
| 2018/0159006 A1 | 6/2018 | Hayashi et al. | |
| 2018/0266642 A1 | 9/2018 | Ohno | |
| 2019/0237638 A1* | 8/2019 | Andrews | H01L 33/507 |
| 2020/0144327 A1* | 5/2020 | Lee | F21K 9/00 362/249.14 |

FOREIGN PATENT DOCUMENTS

| | | |
|---|---|---|
| JP | 2010-010252 A | 1/2010 |
| JP | 2012-142382 A | 7/2012 |
| JP | 2015-528215 A | 9/2015 |
| JP | 2016-027620 A | 2/2016 |
| JP | 2018-081832 A | 5/2018 |
| WO | WO-2017/026093 A1 | 2/2017 |
| WO | WO-201 7/086251 A1 | 5/2017 |
| WO | WO-2019/022026 A1 | 1/2019 |
| WO | WO-2019/098029 A1 | 5/2019 |

* cited by examiner

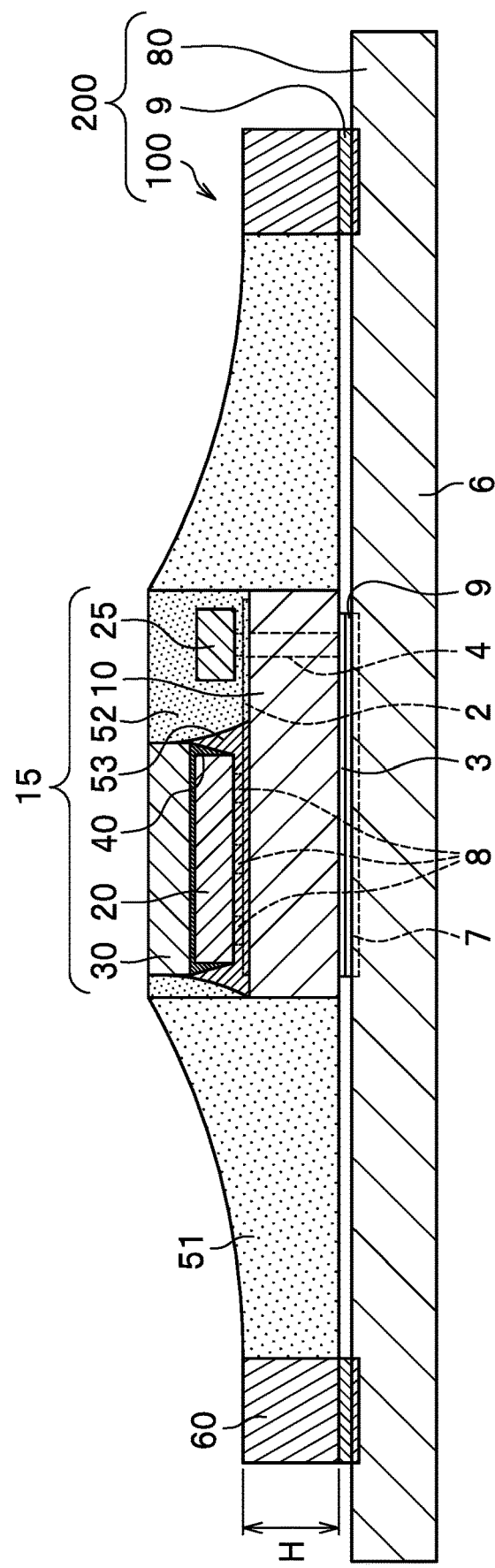

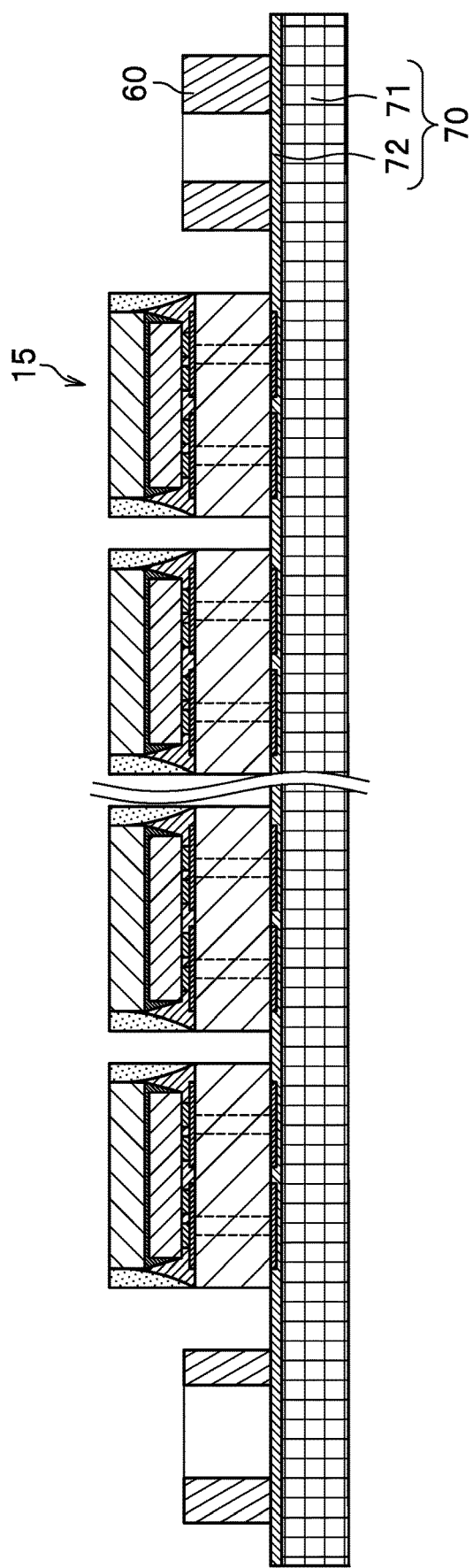

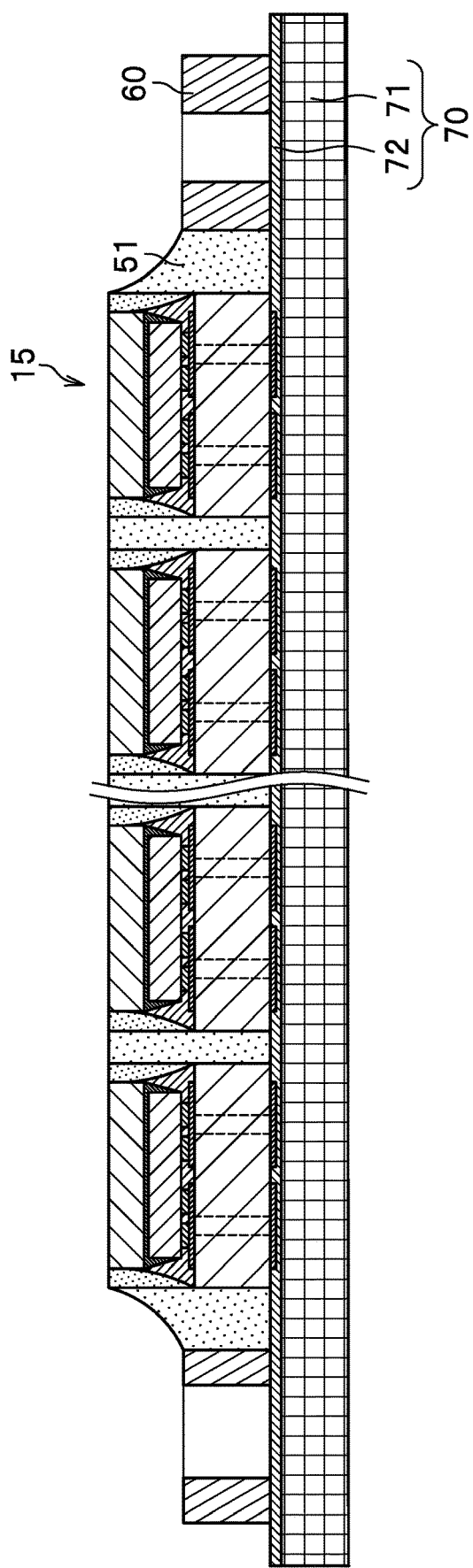

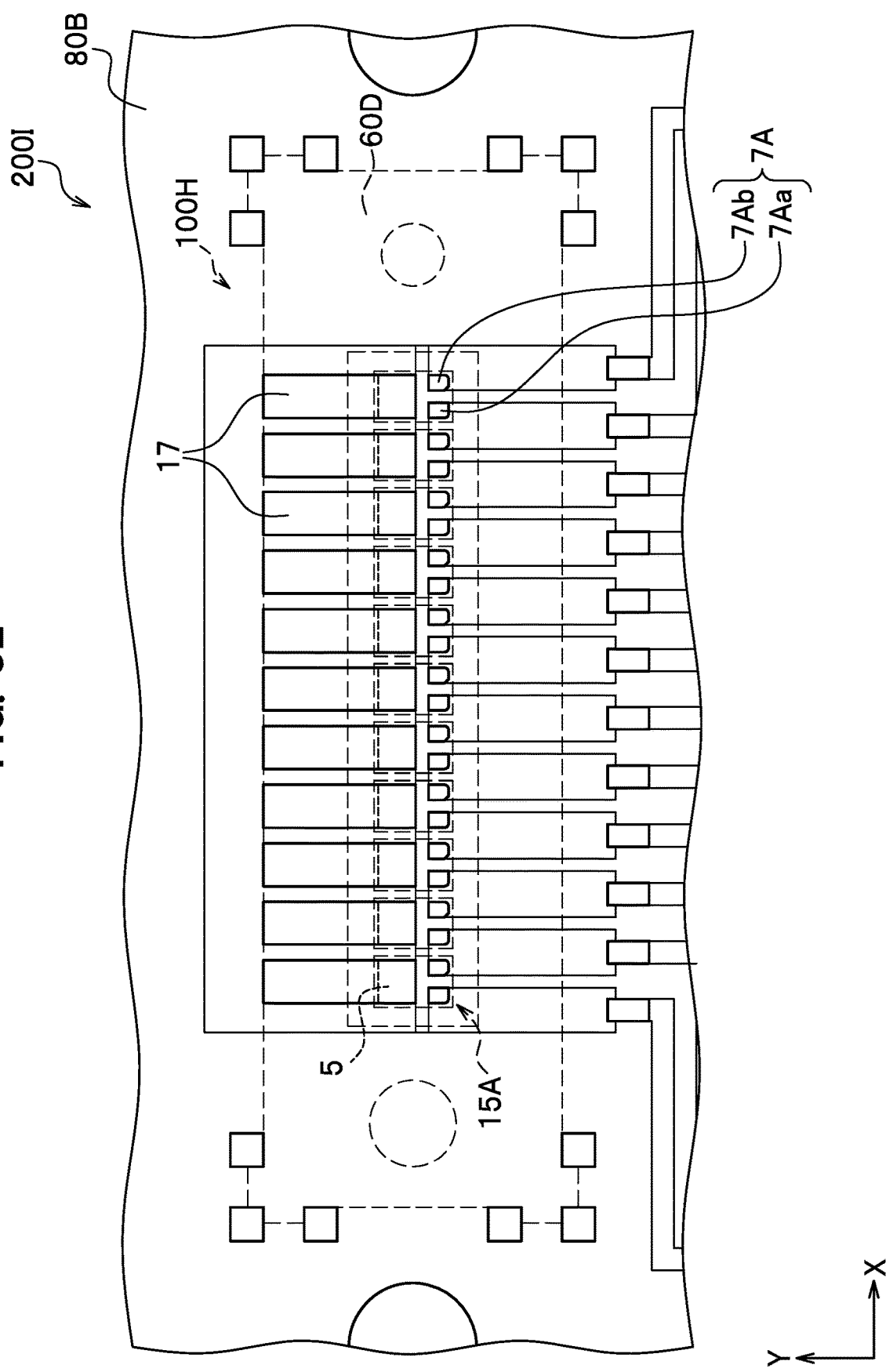

LIGHT EMITTING DEVICE, LIGHT EMITTING MODULE, AND METHOD OF MANUFACTURING LIGHT EMITTING MODULE

CROSS-REFERENCE TO RELATED APPLICATIONS

This application claims priority to Japanese Patent Application No. 2020-069883 filed on Apr. 8, 2020, and Japanese Patent Application No. 2020-161124 filed on Sep. 25, 2020, the disclosures of which are hereby incorporated by reference in their entireties.

BACKGROUND

The present disclosure relates to a light emitting device and a light emitting module, and also relates to a method of manufacturing a light emitting module.

There is known a light emitting device including a plurality of light emitting surfaces. For example, Japanese Patent Publication No. 2018-81832 discloses a light source unit in which 24 light emitting diodes are disposed in each of four rows on a substrate.

SUMMARY

There is room for further improvements in a structure to precisely dispose a plurality of light emitting surfaces with high density.

An object of certain embodiments of the present disclosure is to provide a light emitting device and a light emitting module in which a plurality of light emitting surfaces are precisely dispose with high density, and to provide a method of manufacturing such light emitting module.

A light emitting device according to one embodiment of the present disclosure includes element structural bodies, a first covering member, and a support member. Each of the element structural bodies includes a substrate, a light emitting element mounted on or above the substrate, and a light-transmissive member disposed on or above the light emitting element. At least three of the element structural bodies are disposed along a first direction. The first covering member is configured to cover lateral surfaces of the substrate, the light emitting element, and the light-transmissive member of each of the element structural bodies. The support member is configured to cover a lateral surface of the first covering member, and disposed lateral to the element structural bodies along the one direction. The support member has a rigidity greater than a rigidity of the first covering member.

A light emitting module according to another embodiment of the present disclosure includes the above-described light emitting device, and a module substrate on which the light emitting device is mounted, with the module substrate facing the substrate of the light emitting device.

A method of manufacturing a light emitting module according to another embodiment of the present disclosure includes providing the above-described light emitting device, and mounting the light emitting device so that the substrate faces a module substrate. The module substrate has holes at positions respectively facing through holes of the support member. The mounting the light emitting device includes aligning positions of the through holes of the support member and of the holes of the module substrate to mount the light emitting device on the module substrate.

In a light emitting device according to certain embodiments of the present disclosure, a plurality of light emitting surfaces can be precisely positioned at a desired position with high density. In a light emitting module according to certain embodiments of the present disclosure, a plurality of light emitting surfaces can be precisely positioned at a desired position with high density. With a method of manufacturing a light emitting module according to certain embodiments of the present disclosure, it is possible to precisely position a plurality of light emitting surfaces at a desired position with high density.

BRIEF DESCRIPTION OF DRAWINGS

FIG. 1C is a schematic cross-sectional view taken along line IC-IC of FIG. 1B.

FIG. 4H is a schematic cross-sectional view illustrating an example of the method of manufacturing the light emitting device according to the embodiment.

FIG. 4I is a schematic cross-sectional view illustrating an example of the method of manufacturing the light emitting device according to the embodiment.

FIG. 6E is a schematic top view illustrating, in a partially expanded manner, an example of the light emitting module according to the ninth modification, and is a schematic top view illustrating a positional relationship between the module substrate of FIG. 6D and the light emitting device of FIG. 6A.

DESCRIPTION OF EMBODIMENTS

Figure 1A:
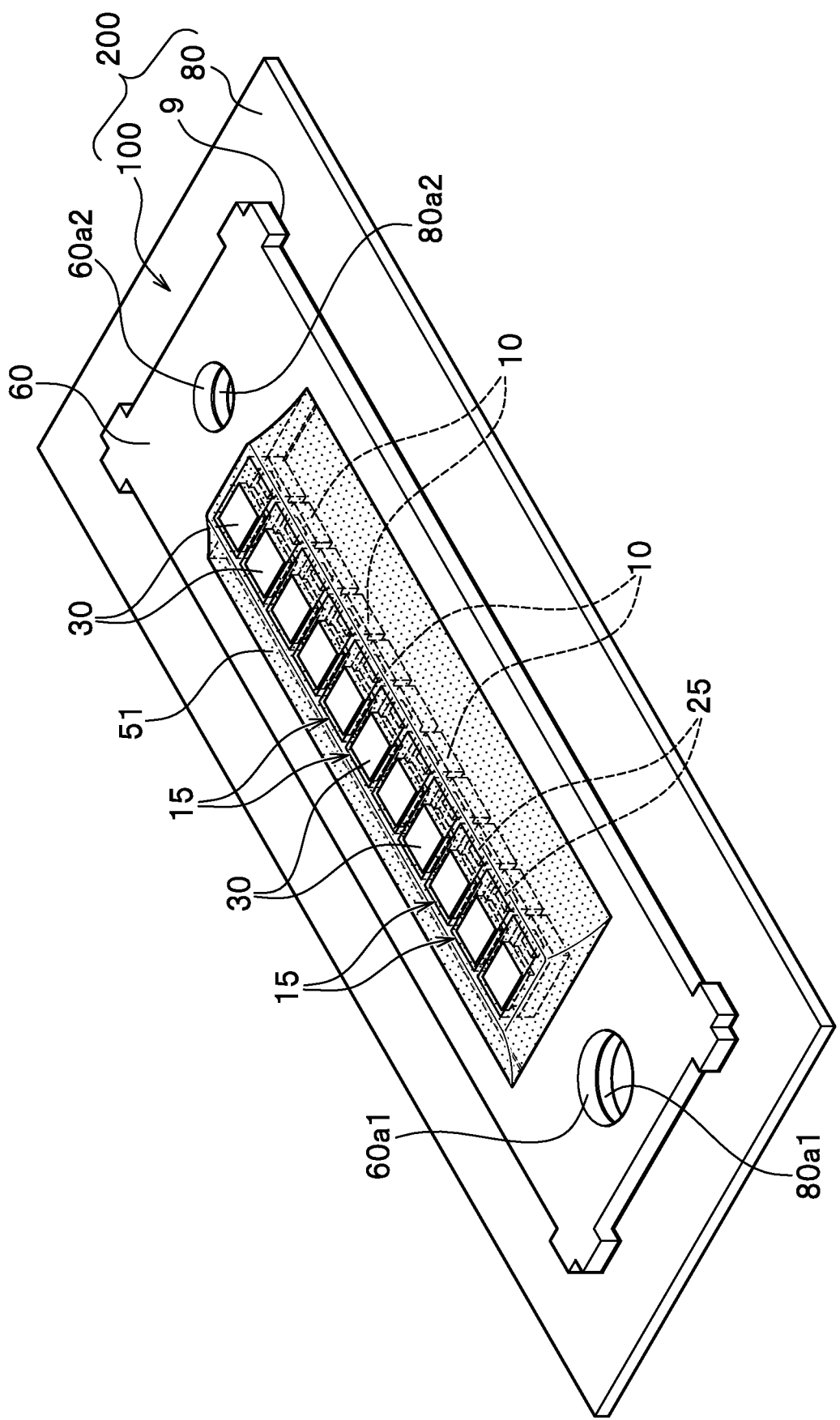
FIG. 1A is a schematic perspective view illustrating an example of a light emitting module including a light emitting device according to certain embodiment.

Embodiments will be described below with reference to the drawings. Note that the following embodiments illustrate a light emitting device, a light emitting module, and a method of manufacturing a light emitting module for embodying the technical concepts of the present invention, but the present invention is not limited to the following embodiments. In addition, dimensions, materials, shapes, relative positions, or the like of components described in the embodiments are merely exemplary and are not intended to limit the scope of the present invention thereto, unless otherwise specified. Note that, size, positional relationship, and the like of members illustrated in the drawings can be exaggerated or simplified for clarity of description. In a cross-sectional view, an end view illustrating only a cutting surface can be used. Moreover, each of members including a light emitting element, an element structural body, and a support illustrated in the drawings is illustrated with the number of components set in an example to facilitate understanding of the described configuration. Furthermore, in the embodiments, "cover," including its several tenses such as covering and covered, encompasses not only a case with direct contact, but also a case with indirect contact, that is, covering via other members, for example.

Embodiments

Figure 1B:
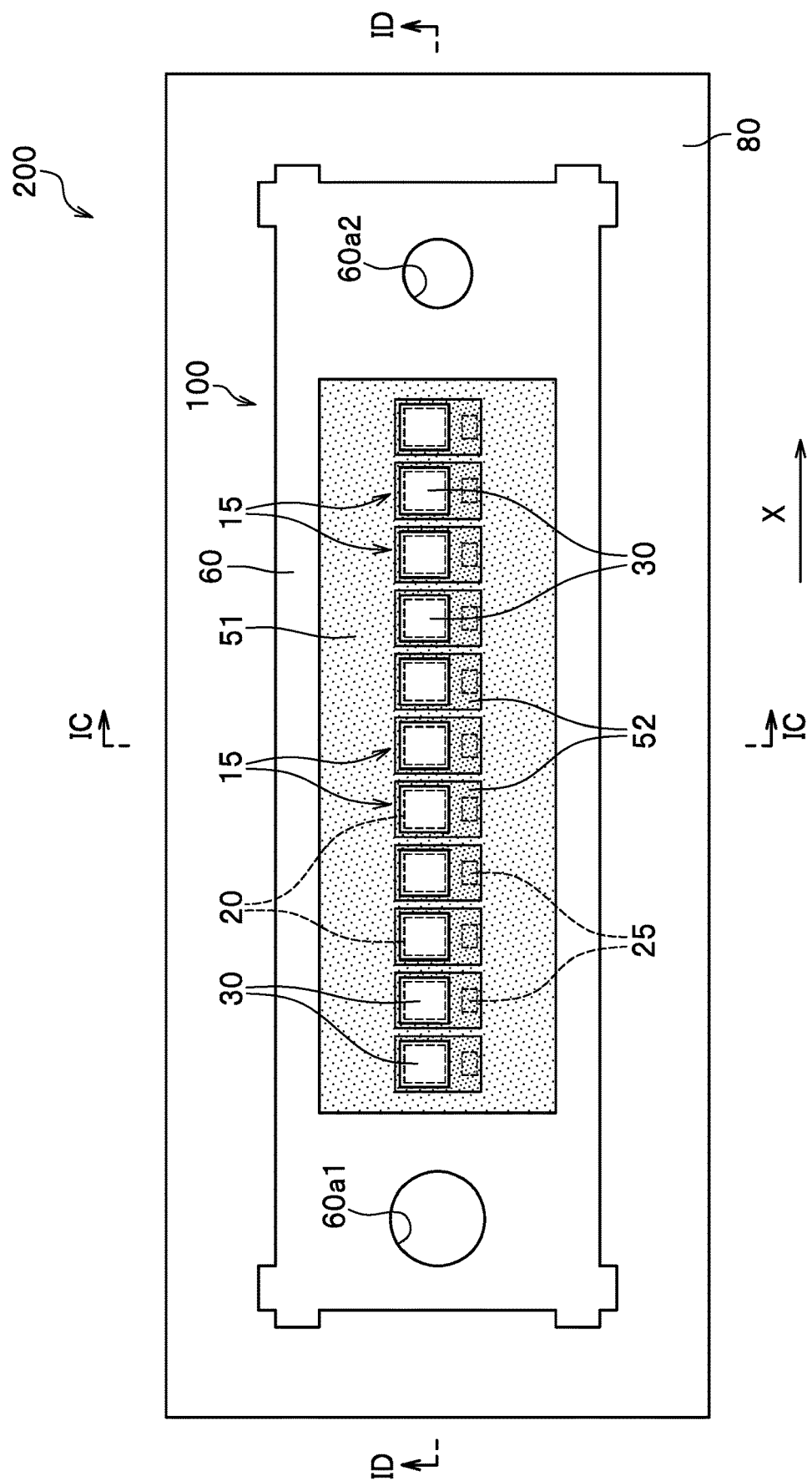
FIG. 1B is a schematic top view illustrating an example of the light emitting module including the light emitting device according to the embodiment.
Figure 1D:
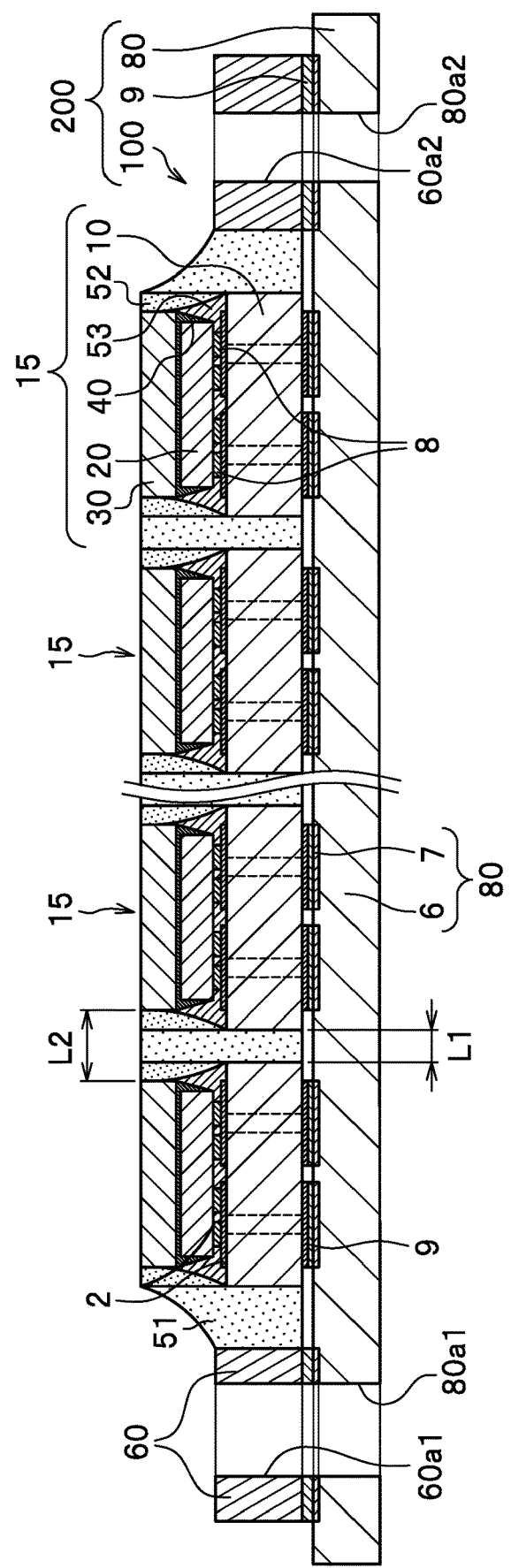
FIG. 1D is a schematic cross-sectional view taken along line ID-ID of FIG. 1B.
Figure 1E:
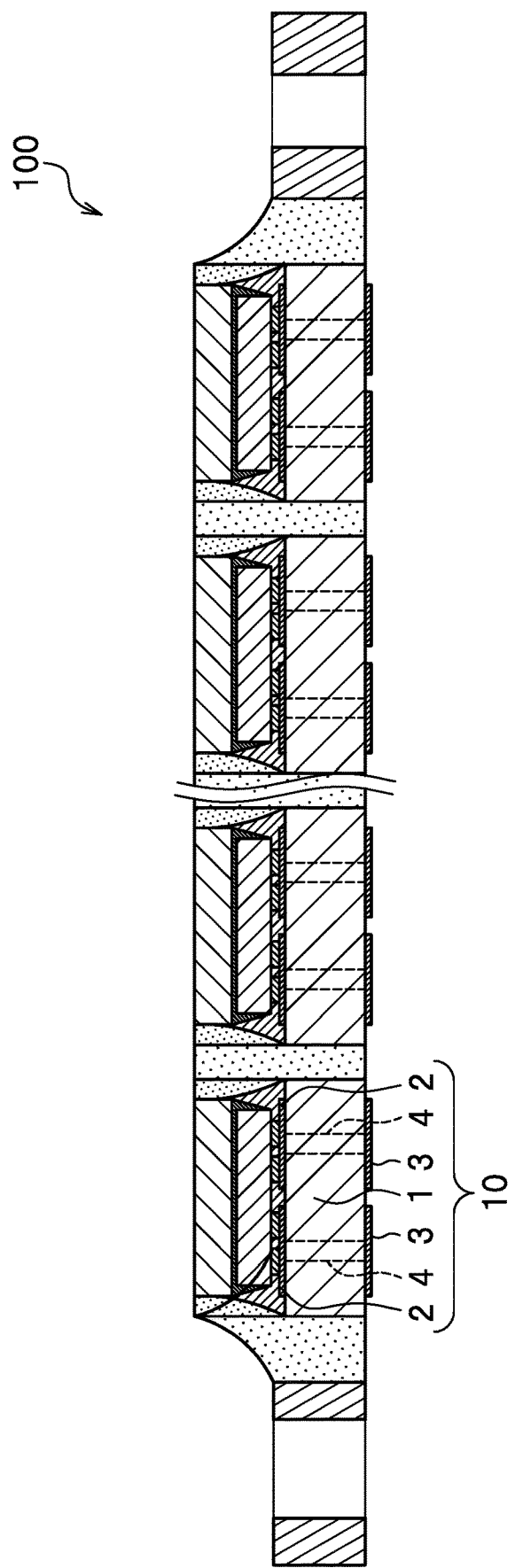
FIG. 1E is a schematic cross-sectional view illustrating an example of the light emitting device according to the embodiment.
Figure 1F:
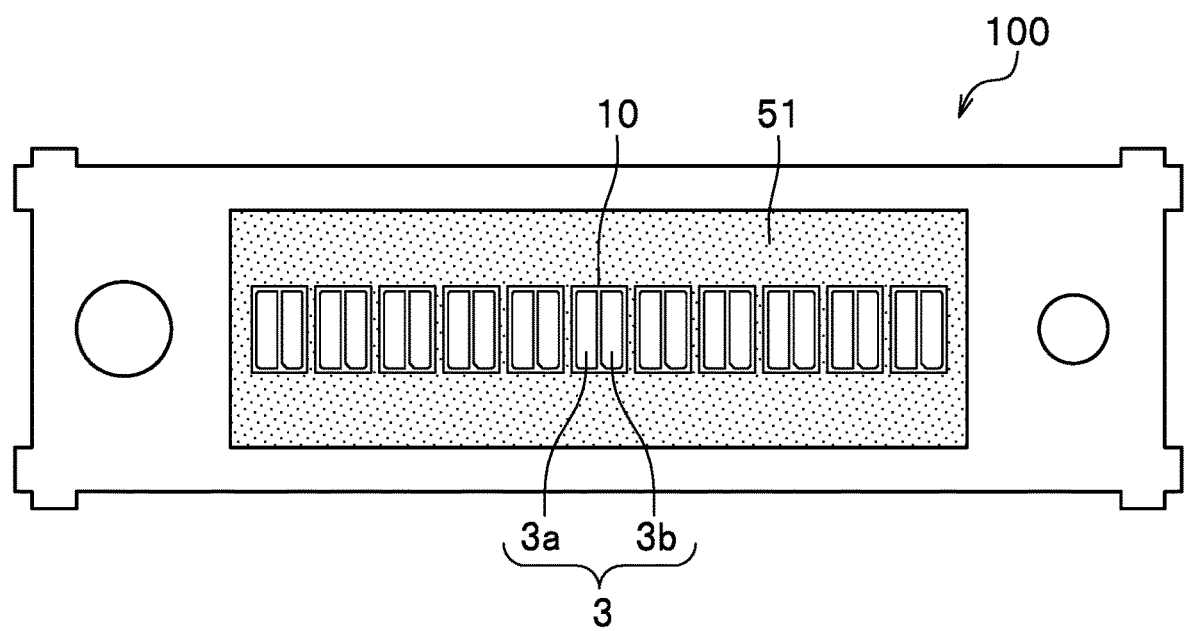
FIG. 1F is a schematic bottom view illustrating an example of the light emitting device according to the embodiment.
Figure 1G:
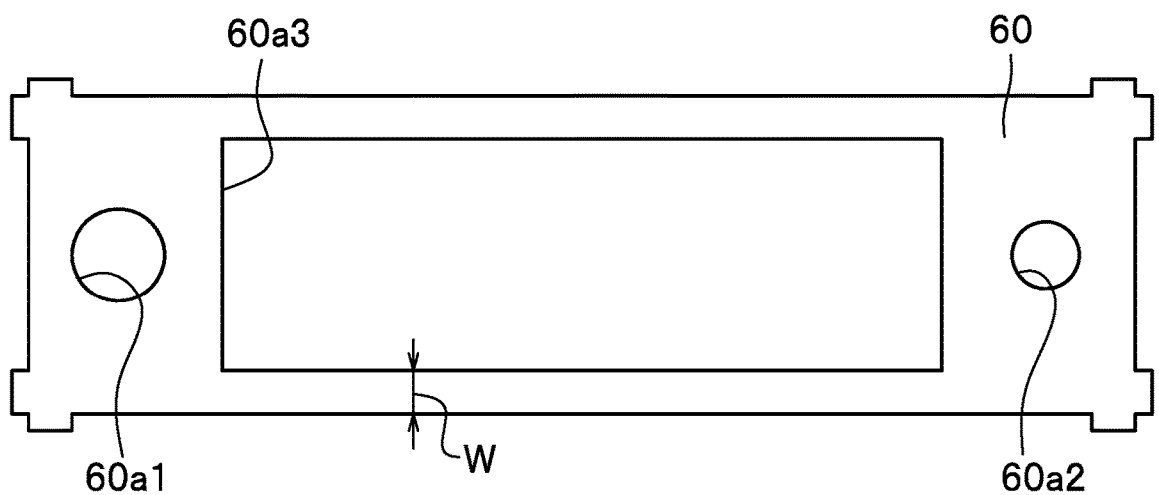
FIG. 1G is a schematic top view illustrating an example of a support member of the light emitting device according to the embodiment.

FIG. 1A is a schematic perspective view illustrating an example of a light emitting module including a light emitting device according to an embodiment. FIG. 1B is a schematic top view illustrating an example of the light emitting module including the light emitting device according to the embodiment. FIG. 1C is a schematic cross-sectional view taken along line IC-IC of FIG. 1B. FIG. 1D is a schematic cross-sectional view taken along line ID-ID of FIG. 1B. FIG. 1E is a schematic cross-sectional view illustrating an example of the light emitting device according to the embodiment. FIG. 1F is a schematic bottom view illustrating an example of the light emitting device according to the embodiment. FIG. 1G is a schematic top view illustrating an example of a support member of the light emitting device according to the embodiment.

Alight emitting module 200 includes a light emitting device 100 and a module substrate 80 on which the light emitting device 100 is mounted.

Light Emitting Device

First, the light emitting device 100 will be described.

The light emitting device 100 includes a plurality of light emitting surfaces on a top surface thereof.

The light emitting device 100 includes a plurality of element structural bodies 15 each including a substrate 10, a light emitting element 20 mounted on or above the substrate 10, and a light-transmissive member 30 disposed on or above the light emitting element 20. At least three of the element structural bodies 15 are disposed along one direction X (i.e., a first direction). The light emitting device 100 further includes a first covering member 51 that covers lateral surfaces of the substrate 10, the light emitting element 20, and the light-transmissive member 30 of each of the element structural bodies 15; and a support member 60 that covers a lateral surface of the first covering member 51, that is disposed lateral to the plurality of element structural bodies 15 along the one direction X, and that has higher rigidity than a rigidity of the first covering member 51.

The light emitting device 100 mainly includes the element structural bodies 15, the first covering member 51, and the support member 60.

Each of the element structural bodies 15 primarily includes the substrate 10, the light emitting element 20, a protecting element 25, the light-transmissive member 30, a light-guiding member 40, a third covering member 53, and a second covering member 52. An external shape of the element structural body 15 is, for example, a substantially rectangular parallelepiped. A top surface of the element structural body 15 includes a top surface of the light-transmissive member 30 and a top surface of the second covering member 52 surrounding the top surface of the light-transmissive member 30. One or more lateral surfaces of the element structural body 15 include one or more lateral surfaces of the second covering member 52 and one or more lateral surfaces of the substrate 10. A bottom surface of the element structural body 15 includes a bottom surface of the substrate 10. In the element structural body 15, in a top view from a direction perpendicular to the top surface of the light-transmissive member 30, the light emitting element 20 and the light-transmissive member 30 are positioned inside the substrate 10. Further, either one of the light emitting element 20 or the light-transmissive member 30 is preferably positioned inside the other of the light emitting element 20 or the light-transmissive member 30.

In the light emitting device 100, each of the plurality of element structural bodies 15 includes the light emitting element 20, and thus, the light emitting element 20 can be driven individually for each of the plurality of element structural bodies 15.

Configurations of the light emitting device 100 will be described below.

The substrate 10 is a component on which the light emitting element 20 and the protecting element 25 are mounted. The substrate 10 has, for example, a substantially rectangular plate shape as seen in a top view. As a result, the plurality of element structural bodies 15 can be disposed close to one another in the light emitting device 100.

The substrate 10 includes wirings for electrically connecting a base 1 with the light emitting element 20 and an external light source, on a top surface of the base 1, a bottom surface thereof, and inside thereof. Examples of a material of such wiring include metals such as Fe, Cu, Ni, Al, Ag, Au, Pt, Ti, W, and Pd, and alloys including at least one type of these metals.

An example of the substrate 10 includes a substrate including a top surface wiring 2 connected to the light emitting element 20 on the top surface on which the light emitting element 20 is mounted, for example, and an external connection electrode 3 (for example, an anode electrode 3a and a cathode electrode 3b) electrically connected to an external power source on the bottom surface opposite to the top surface on which the light emitting element 20 is mounted. In this case, the top surface wiring 2 and the external connection electrode 3 can include a via 4 that extends to both the top surface and the bottom surface, that is, passes through the base 1. As a result, the top surface wiring 2 and the external connection electrode 3 are electrically connected. The base 1 can have a single layer structure or can have a multilayer structure. If the base 1 has a multilayer structure, a via passing through each of the layers can electrically connect the top surface wiring 2 and the external connection electrode 3 on the bottom surface via an inner layer wiring provided between each of the plurality of layers.

An insulating material is preferably employed for the base 1, and a material through which light emitted from the light emitting element 20, external light, and the like are not easily transmitted is preferably employed for the base 1. Examples of the material of the base 1 include: ceramics such as alumina, aluminum nitride, and mullite; a thermoplastic resin such as polyamide (PA), polyphthalamide (PPA), polyphenylene sulfide (PPS), or liquid crystal polymer; and a resin such as an epoxy resin, a silicone resin, a modified epoxy resin, an urethane resin, and a phenol resin.

In particular, ceramics having good heat dissipation are preferably used.

In the light emitting device 100, a distance L1 between the adjacent element structural bodies 15 is preferably in a range from 0.01 mm to 0.15 mm. As a result, a thickness of the first covering member 51 disposed between the element structural bodies 15 can be in a range from 0.01 mm to 0.15 mm, and thus, the adjacent element structural bodies 15 can be brought close or joined together. Further, in the light emitting device 100 including the plurality of element structural bodies 15, each of the plurality of element structural bodies 15 includes the substrate 10, and the first covering member 51 is disposed between the substrates 10, and thus, it is possible to suppress an influence of thermal stress due to expansion or contraction of the substrate 10 resulting from heat generated in each of the element structural bodies 15 and from thermal history at the time of mounting the light emitting device 100.

The light emitting element 20 is mounted on the substrate 10. Any shape, size, and the like can be selected for the light emitting element 20. A shape of the light emitting element 20 in a top view is, for example, rectangular. For example, in order to realize a high-power light emitting device, lengthwise dimension and lateral dimension of the light emitting element 20 in a top view respectively are preferably equal to or greater than 600 μm, and more preferably equal to or greater than 800 μm. Furthermore, from a perspective of uniformity of light emission intensity, ease of mounting, and the like, the lengthwise and lateral dimensions are respectively preferably equal to or less than 1500 μm.

In terms of the color of the light emitted from the light emitting element 20, light with any wavelength appropriate for application can be selected. For example, examples of a blue light (light having a wavelength of 430 to 500 nm) emitting element 20 or a green light (light having a wavelength of 500 to 570 nm) emitting element 20 include those using a nitride-based semiconductor ($In_XAl_YGa_{1-X-Y}N$, $0 \leq X$, $0 \leq Y$, $X+Y \leq 1$), GaP, and the like. Examples of a red light (light having a wavelength of 610 to 700 nm) emitting element 20 include those using not only a nitride-based semiconductor element but also GaAlAs, AlInGaP, and the like.

The light emitting element 20 preferably includes positive and negative element electrodes on one surface, and as a result, the light emitting element 20 can be flip-chip mounted to a wiring on the substrate 10 with an electrically conductive adhesive 8. For example, eutectic solder, electrically conductive paste, or a bump can be employed for the electrically conductive adhesive 8.

For example, a Zener diode can be employed for the protecting element 25. The protecting element 25 includes positive and negative element electrodes on one surface, and is flip-chip mounted to a wiring on the substrate 10 with the electrically conductive adhesive 8. Note that the light emitting device may not include the protecting element 25. A shape of the protecting element 25 in a top view is, for example, rectangular.

The light-transmissive member 30 is a member that is disposed on or above the light emitting element 20 and that transmits light emitted from the light emitting element 20 and emits the light to the outside. Examples of the light-transmissive member 30 include a member that transmits 60% or greater of light from the light emitting element 20 and/or light obtained after a wavelength of light from the light emitting element 20 is converted (for example, light with a wavelength in a range from 320 nm to 850 nm), and preferably include a member that transmits 70% or greater of the light.

The light-transmissive member 30 is a plate-like member including a top surface serving as a main light emitting surface of the individual element structural bodies 15 and the light emitting device 100, and a bottom surface opposite to the top surface. The light-transmissive member 30 can be formed from an inorganic material such as glass, ceramics, or sapphire, or an organic material such as a resin or a hybrid resin containing one or more of silicone resins, modified silicone resins, epoxy resins, modified epoxy resins, acrylic resins, phenol resins, and fluorine resins. The light-transmissive member 30 is disposed on or above the light emitting element 20. The light-transmissive member 30 preferably has a top surface and/or a bottom surface wider than the top surface of the light emitting element 20, and is preferably disposed so as to encompass the light emitting element 20 in a top view.

On the top surface of the light emitting device 100, a distance L2 between the adjacent light-transmissive members 30 is preferably equal to or less than 0.2 mm. As a result, for example, if the light emitting device 100 is employed for a light source of an Adaptive Driving Beam headlight (ADB headlight) of a vehicle, the light source can be reduced in size, and a size of the headlight lens can be reduced.

That is, on the top surface of the light emitting device 100, a space between the adjacent light-transmissive members 30 (that is, between the adjacent light emitting surfaces) is a non-light emitting region, and thus, when the adjacent light-transmissive members 30 are lighted simultaneously, a dark portion may be generated in an irradiated region. Therefore, it is necessary to suitably adjust a configuration of an optical system, for example, by adjusting a focal position of the plurality of light emitting surfaces using a primary lens, so that a dark portion is not generated in an irradiated region. On the other hand, in the light emitting device 100 according to the present embodiment, the distance L2 between the adjacent light emitting surfaces (that is, the top surfaces of the adjacent light-transmissive members 30) can be made smaller than 0.2 mm. As a result, a configuration of an entire light appliance including an optical system such as a lens or the like can be simplified or downsized, that is, the primary lens in the optical system can be omitted, for example. Further, omission of the lens can reduce loss of light when the light passes through the optical system can be reduced.

The distance L2 between the adjacent light-transmissive members 30 is more preferably 0.1 mm or less. An example of the distance L2 between the light-transmissive members 30 includes 0.02 mm or greater, from a perspective of ease of manufacturing the element structural body 15 and the light emitting device 100.

A planar shape of the light-transmissive member 30 is rectangular, for example. As a result, the plurality of light emitting surfaces can be highly densely positioned in close proximity. In particular, the planar shape of the light-transmissive member 30 is preferably similar to the planar shape of the light emitting element 20. An area of the bottom surface of the light-transmissive member 30 is preferably approximately 0.8 to 1.5 times an area of the top surface of the light emitting element 20. An entire thickness of the light-transmissive member 30 can be constant or can be partially thin or thick. The thickness of the light-transmissive member 30 can be, for example, in a range from 50 μm to 300 μm.

The light-transmissive member 30 can contain phosphor that can convert a wavelength of at least a part of incident light. Examples of the light-transmissive member 30 containing the phosphor include sintered bodies of one or more phosphors and members in which one or more phosphors are contained in the one or more materials described above. Further, the light-transmissive member 30 can include a phosphor layer such as a resin layer containing a phosphor, a glass layer containing a phosphor, or the like, on a surface of a body formed of resin, glass, ceramics, or the like. Furthermore, the light-transmissive member 30 can contain a filler such as a diffusing material depending on a purpose. Furthermore, if a filler such as a diffusing material is contained, the light-transmissive member 30 can include a filler contained in the above-described material, and can include a diffusing material layer such as a resin layer containing a filler, a glass layer containing a filler, or the like, on the surface of a body formed of resin, glass, ceramics, or the like.

Phosphors known in the art can be employed for the phosphor. Examples of a phosphor that emits green light include a yttrium aluminum garnet-based phosphor (for example, $Y_3(Al,Ga)_5O_{12}:Ce$), a lutetium aluminum garnet-based phosphor (for example, $Lu_3(Al,Ga)_5O_{12}:Ce$), a terbium-aluminum-garnet-based phosphor (for example, $Tb_3(Al,Ga)_5O_{12}:Ce$), a silicate-based phosphor (for example, $(Ba,Sr)_2SiO_4:Eu$), a chloro-silicate-based phosphor (for example, $CasMg(SiO_4)_4Cl_2:Eu$), a β-sialon-based phosphor (for example, $Si_{6-z}Al_zO_zN_{8-z}:Eu(0<z<4.2)$), and an SGS-based phosphor (for example, $SrGa_2S_4:Eu$). Examples of a phosphor that emits yellow light include an α-sialon-based phosphor (for example, $Mz(Si,Al)_{12}(O,N)_{16}$ (wherein $0<z≤2$, and M is Li, Mg, Ca, Y, and a lanthanide element excluding La and Ce)). In addition, the above phosphors that emit green light include a phosphor that emits yellow light.

For example, if Y is partially substituted with Gd in the yttrium aluminum garnet-based phosphor, a light emission peak wavelength can be shifted to a long wavelength side, and thus, the yttrium aluminum garnet-based phosphor can emit yellow light. Further, some of the above phosphors are a phosphor that can emit orange light. Examples of a phosphor that emits red light include a nitrogen-containing calcium aluminosilicate (CASN or SCASN)-based phosphor (for example, $(Sr,Ca)AlSiN_3:Eu$) and a BSESN-based phosphor (for example, $(Ba,Sr,Ca)_2Si_5N_8:Eu$). In addition, another example includes a manganese-activated fluoride-based phosphor (a phosphor represented by a general formula (I) $A_2[M_{1-a}Mn_aF_6]$ (wherein in the above general formula (I), A is at least one selected from the group consisting of K, Li, Na, Rb, Cs, and $NH_4$, M is at least one element selected from the group consisting of Group 4 elements and Group 14 elements, and a satisfies 0<a<0.2)). A typical example of the manganese-activated fluoride-based phosphor includes a manganese-activated potassium fluorosilicate phosphor (for example, $K_2SiF_6$:Mn).

Diffusing materials known in the art can be employed for the diffusing material. For example, silica, alumina, barium titanate, and titanium oxide can be employed.

Further, if a resin is employed for a binder of a phosphor layer and a diffusing material layer, examples of the resin include a thermosetting resin such as an epoxy resin, a modified epoxy resin, a silicone resin, or a modified silicone resin.

The light-guiding member 40 is disposed between the light-transmissive member 30 and the light emitting element 20 and/or on lateral surface(s) of the light emitting element 20. The light-guiding member 40 is a member that facilitates extraction of light from the light emitting element 20 and guides light from the light emitting element 20 to the light-transmissive member 30. The light-guiding member 40 is, for example, an adhesive member that joins the light emitting element 20 and the light-transmissive member 30. The light-guiding member 40 that joins the light emitting element 20 and the light-transmissive member 30 preferably extends from a space between the light-transmissive member 30 and the light emitting element 20, and is preferably disposed on the lateral surface(s) of the light emitting element 20. As a result, the light emitted from the lateral surface(s) of the light emitting element 20 can be guided to the light-transmissive member 30 to improve an extraction efficiency of the light from the light emitting element 20.

The light-guiding member 40 has a shape inclined in a cross-sectional view so that a width of the light-guiding member 40 expands from the bottom surface side of the light emitting element 20 (that is, a side of a joint surface with the substrate 10) toward the light-transmissive member 30. With such a configuration, light traveling in a lateral direction from the light emitting element 20 is easily reflected upward, and thus, the light extraction efficiency is further improved. A cross-sectional shape of an outer surface of the light-guiding member 40 can be a straight line shape or a curved shape. For example, if the outer surface of the light-guiding member 40 in a cross-sectional view is in a curved shape, the curved shape can be a curved shape protruding toward a side of the third covering member 53, or can be a curved shape recessed toward a side of the light emitting element 20.

The light-guiding member 40 can suffice to cover a light emitting region of the lateral surface(s) of the light emitting element 20, but from a viewpoint of improving the light extraction efficiency, it is more preferable that the light-guiding member 40 covers a substantially entire lateral surface(s) of the light emitting element 20.

For example, a light-transmissive resin can be employed for the light-guiding member 40. Additionally, examples of a material of the light-guiding member 40 can include a resin employed in the above-described light-transmissive member 30. Further, the above-described diffusing material can also be contained. As a result, light can more evenly enter the light-transmissive member 30 to suppress color unevenness of the light emitting device 100.

The third covering member 53 is provided on the substrate 10 around the light emitting element 20. The third covering member 53 covers the lateral surface(s) of the light emitting element 20 and is provided to extend from the lateral surface of the light emitting element 20 to the top surface of the substrate 10. The third covering member 53 can increase an adhesive strength between the substrate 10 and the light emitting element 20. Here, the third covering member 53 covers the lateral surface(s) of the light emitting element 20 with the light-guiding member 40 disposed therebetween.

The third covering member 53 is formed in a fillet shape along the lateral surface of the light emitting element 20 from a side of the light-transmissive member 30 toward a side of the substrate 10. In other words, a cross-sectional shape of an outer surface of the third covering member 53 has a shape inclined so that a width of the third covering member 53 expands from the side of light-transmissive member 30 toward the substrate 10, for example. The cross-sectional shape of the outer surface of the third covering member 53 can be a straight line shape or a curved shape. For example, if the outer surface of the third covering member 53 in a cross-sectional view is in a curved shape, the curved shape of the third covering member 53 can be a curved shape protruding toward a side of the second covering member 52, or can be a curved shape recessed toward a side of the light emitting element 20.

The third covering member 53 preferably employs a resin. The third covering member 53 can be formed, for example, from a white resin having light reflectivity.

Examples of the third covering member 53 include a member obtained by containing a reflective material into a light-transmissive resin. Examples of the resin employed for the third covering member 53 include an epoxy resin, a modified epoxy resin, a silicone resin, and a modified silicone resin. In particular, it is preferable to employ a silicone resin having good light resistance and heat resistance. Examples of the reflective material include titanium oxide, silica, alumina, zirconium oxide, magnesium oxide, potassium titanate, zinc oxide, silicon nitride, boron nitride. Among these, from the perspective of light reflection, titanium oxide having a relatively high refractive index is preferably employed.

The third covering member 53 can suffice to cover at least a portion of the lateral surface(s) of the light emitting element 20. It is preferable that the third covering member 53 covers the entire lateral surface(s) of the light emitting element 20. It is more preferable that the third covering member 53 extends from the lateral surface(s) of the light emitting element 20 to cover at least a portion of the lateral surface(s) of the light-transmissive member 30. As a result, in the individual element structural bodies 15, a leakage of light emitted from the lateral surface(s) of the light emitting element 20 in a lateral direction can be suppressed. Furthermore, in the light emitting device 100 including the plurality of element structural bodies 15, a leakage of light to the adjacent element structural bodies 15 is suppressed, and the light emitting device 100 having only a minor light emission unevenness can be realized. In addition, if the lateral surface(s) of the light-transmissive member 30 is covered by the third covering member 53, when an optical characteristic of the element structural body 15 is measured, the optical characteristic can be more easily measured because chromaticity coordinates of the element structural body 15 can be easily recognized, for example. Furthermore, as described below, when a sorting step is performed after a block of element structural bodies are separated into individual element structural bodies 15, the chromaticity coordinates of the element structural body 15 are more easily understood.

The third covering member 53 is preferably disposed also between the light emitting element 20 and the substrate 10. As a result, light traveling downward from the light emitting element 20 is reflected by the third covering member 53, and the light extraction efficiency of the light emitting device 100 can be further improved.

The light emitting device 100 includes the plurality of element structural bodies 15, and each of the plurality of element structural bodies 15 includes the third covering member 53 that covers the lateral surface(s) of the light emitting element 20, and thus, a leakage of light emitted from the light emitting element 20 in a lateral direction can be suppressed. This can allow the plurality of element structural bodies 15 to be disposed close to one another without reducing the light extraction efficiency of the individual element structural bodies 15.

The second covering member 52 is a member that covers the lateral surface(s) of the light emitting element 20 and the lateral surface(s) of the light-transmissive member 30 on the substrate 10. The second covering member 52 covers the lateral surface(s) of the light emitting element 20 via the light-guiding member 40 and the third covering member 53, and covers the lateral surface(s) of the light-transmissive member 30.

When the second covering member 52 is provided, the element structural body 15 can have a substantially rectangular parallelepiped shape. As a result, in the light emitting device 100, the first covering member 51 can be disposed between the element structural bodies 15 at approximately the same width from the bottom surface to the top surface of the element structural bodies 15.

A resin is preferably employed for the second covering member 52. The second covering member 52 can be formed, for example, from a white resin having light reflectivity. The second covering member 52 covers the lateral surface(s) of the light emitting element 20 and the lateral surface(s) of the light-transmissive member 30. Examples of the resin employed for the second covering member 52 include the examples described with respect to the resin employed in the third covering member 53. Examples of the reflective material contained in the resin used in the second covering member 52 include the examples described with respect to the reflective material employed in the third covering member 53.

The first covering member 51 is a member provided around the plurality of element structural bodies 15. A resin is preferably employed for the first covering member 51. The first covering member 51 can be formed, for example, from a white resin obtained by containing a reflective material into a light-transmissive resin. The first covering member 51 covers the lateral surface(s) of the element structural body 15. That is, the first covering member 51 covers the lateral surface(s) of the substrate 10, covers the lateral surface(s) of the light emitting element 20 via the light-guiding member 40, the third covering member 53, and the second covering member 52, and covers the lateral surface(s) of the light-transmissive member 30 via the second covering member 52. The first covering member 51 is provided between the adjacent element structural bodies 15, and covers the lateral surface(s) of each of the plurality of element structural bodies 15 in a state in which the top surfaces of the element structural bodies 15 are exposed.

Examples of the resin employed for the first covering member 51 include the examples described with respect to the resin employed in the third covering member 53. Examples of the reflective material contained in the resin used in the first covering member 51 include the examples described with respect to the reflective material employed in the third covering member 53.

The first covering member 51 can be a colored resin. Examples of the colored resin include a black resin, and a gray resin. A black resin and a gray resin have higher light absorption than a white resin. Thus, if the first covering member 51, which is a black resin or a gray resin, is provided between the element structural bodies 15, a leakage of light in the lateral direction between the element structural bodies 15 can be effectively suppressed. If the black resin or the gray resin is employed for the first covering member 51, the element structural body 15 is preferably configured to include the second covering member 52 so that the black resin or the gray resin and the light-transmissive member 30 are separated. This makes it possible to suppress the effect of light absorption due to the use of the black resin or the gray resin between the element structural bodies 15. As a result, a light emitting device with good "light-dark boundary" is achieved by having a high contrast between a light emitting region and a non-light emitting region when the element structural bodies 15 are individually lit, which allows for suppression of a decrease of the light extraction efficiency of the light emitting surface.

Examples of the black resin or the gray resin include a resin containing a black pigment such as carbon black and graphite. If the black pigment and a white pigment such as the above-described reflective material are combined and each of added amounts is adjusted, a concentration of color such as black or gray can be adjusted. A red pigment, a blue pigment, a green pigment, and the like can be combined to achieve black, gray, and other desired colors.

In the light emitting device 100, the plurality of element structural bodies 15 each including the light emitting surface are held by the first covering member 51. With the first covering member 51, the element structural bodies 15 can be each held in a desired arrangement, and thus, the plurality of light emitting surfaces can be highly densely disposed.

The support member 60 is a member that covers the lateral surface(s) of the first covering member 51 and is disposed along sides of the plurality of element structural bodies 15 in the one direction X. The support member 60 has a side that faces the plurality of element structural bodies 15 and is parallel to the one direction X. For example, the support member 60 can be a frame-shaped member surrounding the plurality of element structural bodies 15. Here, the support member 60 is provided as a frame that surrounds the plurality of element structural bodies 15 and supports the first covering member 51. The support member 60 is, for example, a substantially rectangular frame shape in a top view, and is provided around the plurality of element structural bodies 15.

The support member 60 is formed of a member or a structure having rigidity greater than the first covering member 51. Specifically, the support member 60 has a rigidity greater than a value of a stress (rigidity) that causes the first covering member 51 to warp. Here, "rigidity" indicates difficulty in deformation against a bending force or a tension force, and is expressed by a force required to cause a unit deformation (bending or tension), in other words, a force calculated by dividing load by a deformation amount. When the rigidity of each member is compared, a magnitude of a force required to apply the same amount of deformation in a range that can be considered as being an elastic deformation, is compared. The rigidity increases if a material having a high elastic modulus such as Young's modulus (tensile elastic modulus) is employed. In addition, the rigidity also increases by increasing a plate thickness if a thickness of the same material can be changed. In composite materials, the rigidity is compared by using a magnitude of a force required to cause a unit deformation (bending or tension), and is calculated by dividing load by deformation amount. For example, in a bending test, stresses at a bending strain of 0.05% and that of 0.25% can be evaluated in accordance with JIS K 7171:2016 to compare the rigidity.

The light emitting device 100 includes the support member 60 having a rigidity greater than a rigidity of the first covering member 51, and thus, the first covering member 51 is suppressed from being warped. This may suppress the light emitting device 100 from being warped. As a result, a mounting surface of the light emitting device 100 is flat, and consequently, the light emitting device 100 can be precisely disposed at a desired position of the module substrate 80. In the light emitting device 100, the plurality of element structural bodies 15 are linked by the first covering member 51. Therefore, if a resin is employed for the first covering member 51, the light emitting device 100 may be warped due to shrinkage of the resin during curing, for example. However, if a material having a rigidity greater than the rigidity of the first covering member 51, for example, a non-flexible material, is employed for the support member 60, the occurrence of warping can be suppressed. As a result, the light emitting device 100 can be mounted favorably to the module substrate 80, and the light emitting device 100 in which the plurality of light emitting surfaces are highly densely disposed can be more precisely disposed at a desired position of the module substrate 80.

An electrically conductive member such as a metal, an alloy, or an insulating member such as a ceramic can be employed for the support member 60. Examples of the electrically conductive member include a metal such as Fe, Cu, Ni, Al, Ti, or W, or an alloy including at least one element of Fe, Cu, Ni, Al, Ag, Au, Pt, Ti, W, Pd, or the like. Examples of the insulating material include ceramics such as alumina oxide or aluminum nitride, and a resin formed body formed of a phenol resin, an epoxy resin, a silicone resin, a polyimide resin, a BT resin, polyphthalamide, or the like. In a case in which a resin is used, inorganic fillers such as glass fibers, silicon oxide, titanium oxide, or aluminum oxide, can be mixed in the resin as necessary. Furthermore, a composite obtained by combining such an electrically conductive member and such an insulating member can be employed for the support member, and an example of the composite includes a support member in which a metal member is embedded into a resin molded body.

The support member 60 is preferably a frame-shaped member surrounding the plurality of element structural bodies 15. Furthermore, the support member 60 is more preferably a frame-shaped member having a substantially rectangular opening in a top view including two sides parallel to the one direction X with the plurality of element structural bodies 15 being interposed therebetween and two sides perpendicular to the one direction X with the plurality of element structural bodies 15 being interposed therebetween. As a result, all of the lateral surface(s)s of the first covering member 51 being in contact with the support member 60 can be fixed by the support member 60, and thus, an occurrence of warping can be more effectively suppressed.

A height H from the top surface to the bottom surface of the support member 60 is preferably lower than a height from the top surface to the bottom surface of the element structural body 15. As a result, in the light emitting device 100, the top surface of the support member 60 can be positioned lower than the top surface of the element structural body 15 (that is, on a bottom surface side of the light emitting device 100 relative to the top surface of the element structural body 15). With such a configuration, creeping of the first covering member 51 onto the top surface of the light-transmissive member 30 during manufacturing of the light emitting device 100 is suppressed.

The height H of the support member 60 is preferably in a range from 0.1 mm to 1.0 mm. If the height H of the support member 60 is equal to or greater than 0.1 mm, the rigidity of the support member 60 itself can be ensured and an effect of suppressing the occurrence of the warpage of the light emitting device 100 is further enhanced, and as a result, the support member 60 can be disposed more precisely at a desired position. On the other hand, if the height H of the support member 60 is equal to or less than 1.0 mm, the light emitting device 100 can be further reduced in weight and size.

In the support member 60, a width W of a portion disposed across the side of the plurality of element structural bodies 15 is preferably in a range from 0.5 mm to 2.0 mm. Here, the width W refers to the shortest length between an outer side and an inner side of the frame-shaped support member 60 in a direction perpendicular to the one direction X, on a side of the frame shape that is parallel to the one direction X and faces the element structural body 15. If the width W is equal to or greater than 0.5 mm, the rigidity of the support member 60 itself can be ensured and an effect of suppressing the occurrence of the warpage of the light emitting device 100 is further enhanced, and as a result, the support member 60 can be disposed more precisely at a desired position. On the other hand, if the width W is equal to or less than 2.0 mm, the light emitting device 100 can be further reduced in weight and size.

The support member 60 preferably has at least one through hole to facilitate mounting to the module substrate 80. For example, the support member 60 is a frame having a substantially rectangular opening in a top view including two sides parallel to the one direction X and two sides perpendicular to the one direction X, where through holes 60a1 and 60a2 are preferably provided at positions respectively corresponding to the two sides perpendicular to the one direction X. Here, the through holes 60a1 and 60a2 are provided on an extension line of a row of the element structural bodies 15 aligned in a single row along the one direction X. As a result of the support member 60 having the through holes 60a1 and 60a2, when the light emitting device 100 is mounted on the module substrate 80, as described below, if the through hole 60a1 is aligned with a hole 80a1 of the module substrate 80 and the through hole 60a2 is aligned with a hole 80a2 of the module substrate 80, misalignment is suppressed, and as a result, a mounting accuracy is improved. This can facilitate mounting of the light emitting device 100 on the module substrate 80. Further, for example, in a case in which the module substrate 80 on which the light emitting device 100 is mounted is further employed in a vehicle lighting appliance such as a headlight, the holes 80a1 and 80a2 of the module substrate 80 are aligned with positioning pins provided on a side of the lighting appliance to suppress misalignment. This can facilitate mounting of the light emitting module 200 into the vehicle lighting appliance.

Additionally, the through hole 60a1 being one of the through holes and the through hole 60a2 being another of the through holes are preferably different in size, for example, in diameter, from each other. If the through holes 60a1 and 60a2 different in size are provided, in a manufacturing process of the light emitting device 100, when the element structural bodies 15 are disposed in each of the plurality of support members 60 disposed in two dimensions, erroneous recognition of the support members 60 in the left and right directions can be suppressed.

Figure 5A:
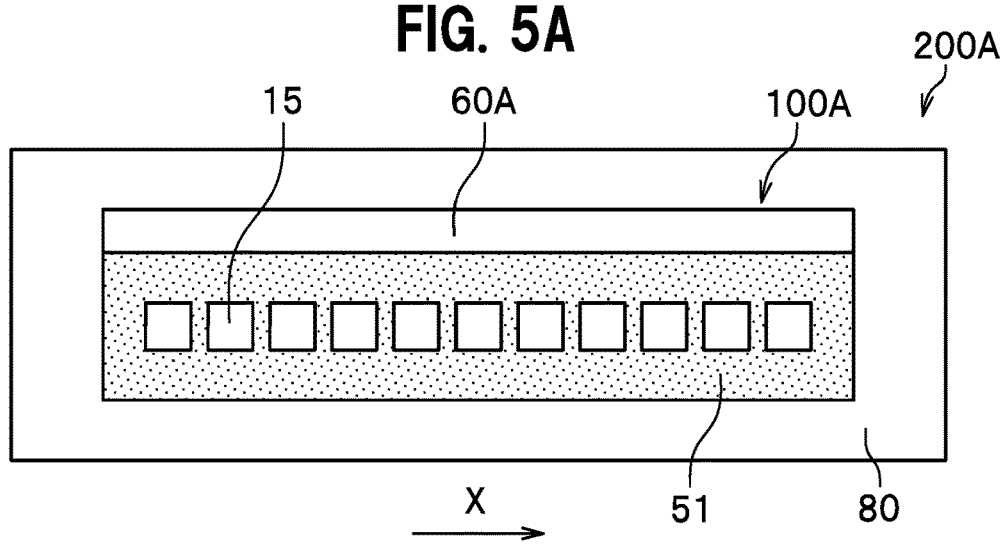
FIG. 5A is a schematic top view illustrating an example of a light emitting module including a light emitting device according to a first modification.
Figure 5B:
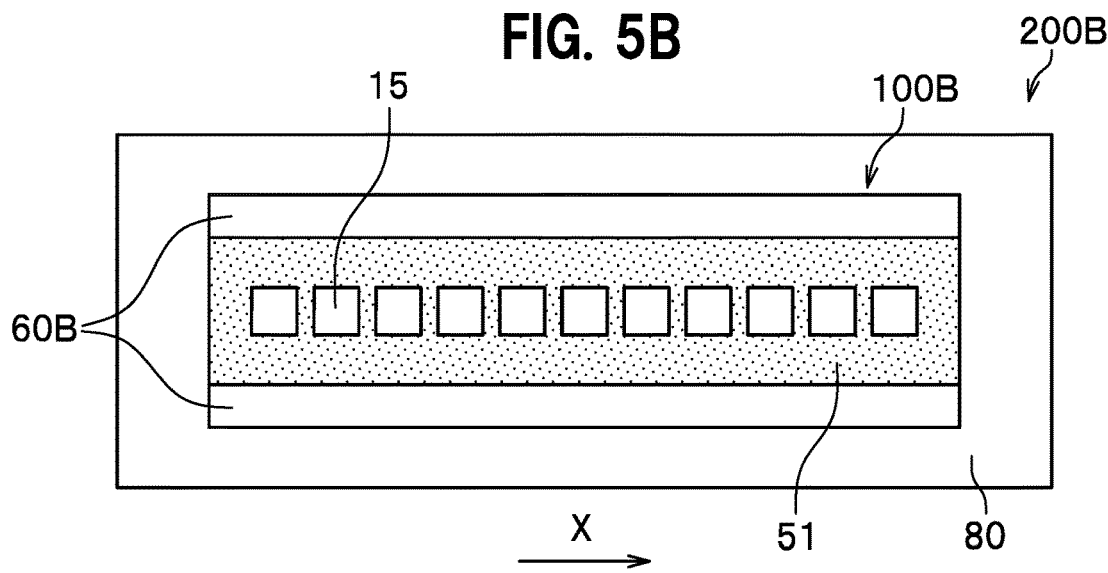
FIG. 5B is a schematic top view illustrating an example of a light emitting module including a light emitting device according to a second modification.
Figure 5C:
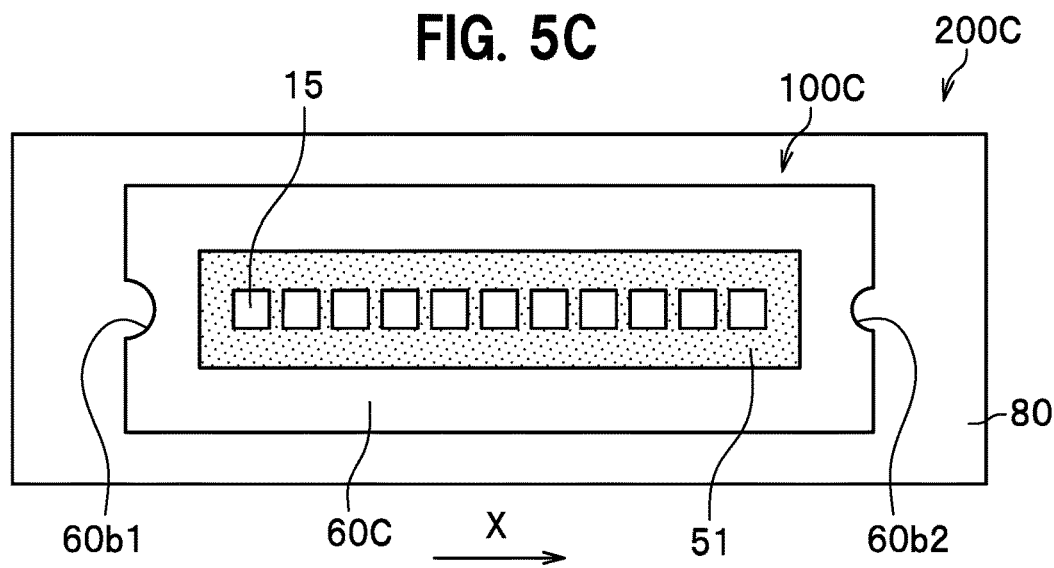
FIG. 5C is a schematic top view illustrating an example of a light emitting module including a light emitting device according to a third modification.
Figure 5D:
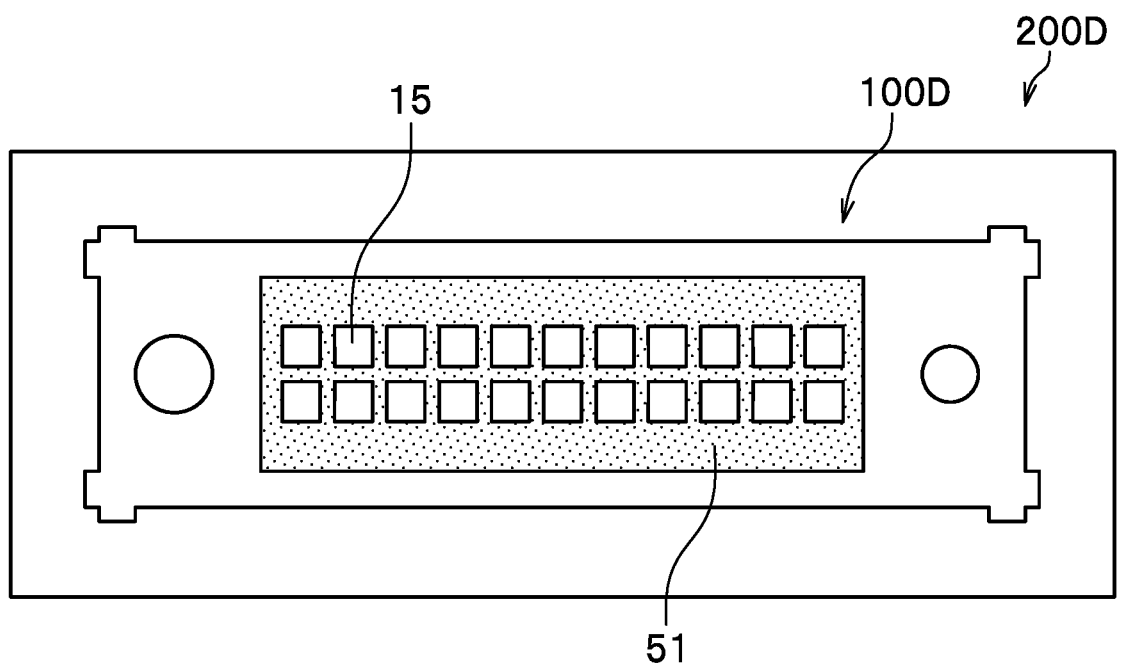
FIG. 5D is a schematic top view illustrating an example of a light emitting module including a light emitting device according to a fourth modification.
Figure 5E:
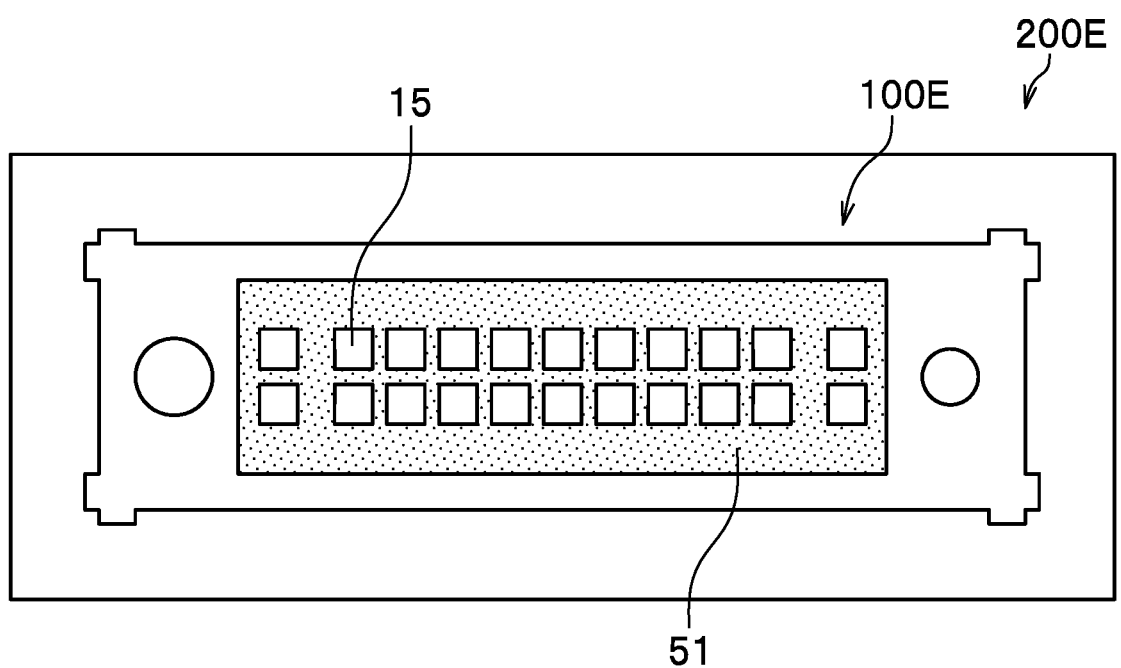
FIG. 5E is a schematic top view illustrating an example of a light emitting module including a light emitting device according to a fifth modification.
Figure 5F:
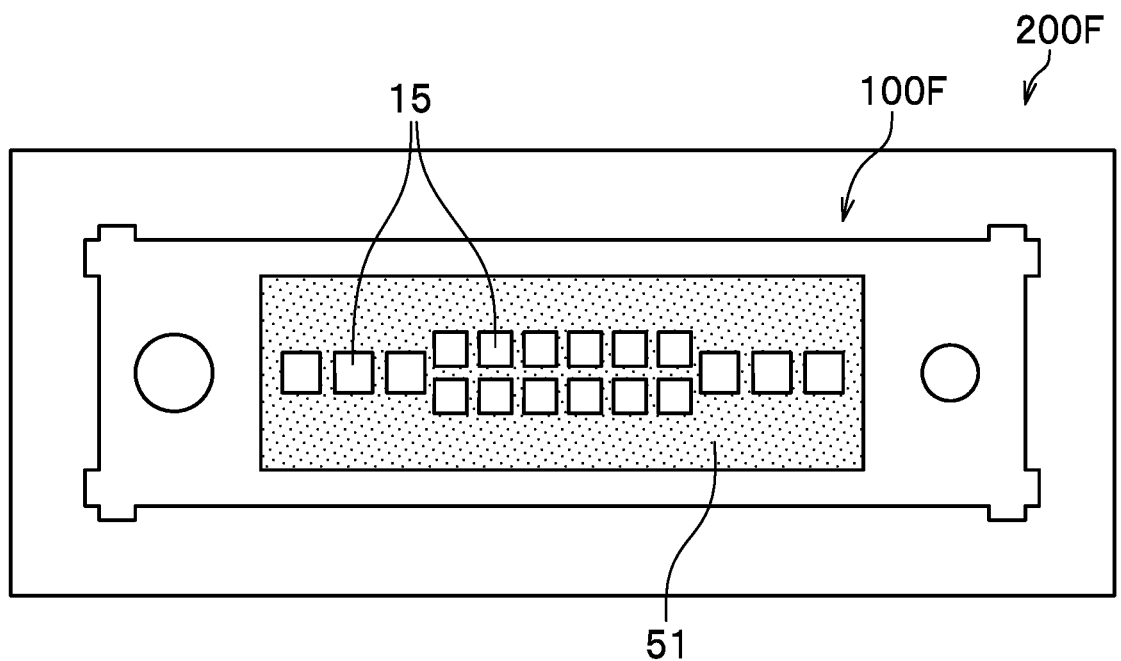
FIG. 5F is a schematic top view illustrating an example of a light emitting module including a light emitting device according to a sixth modification.
Figure 5G:
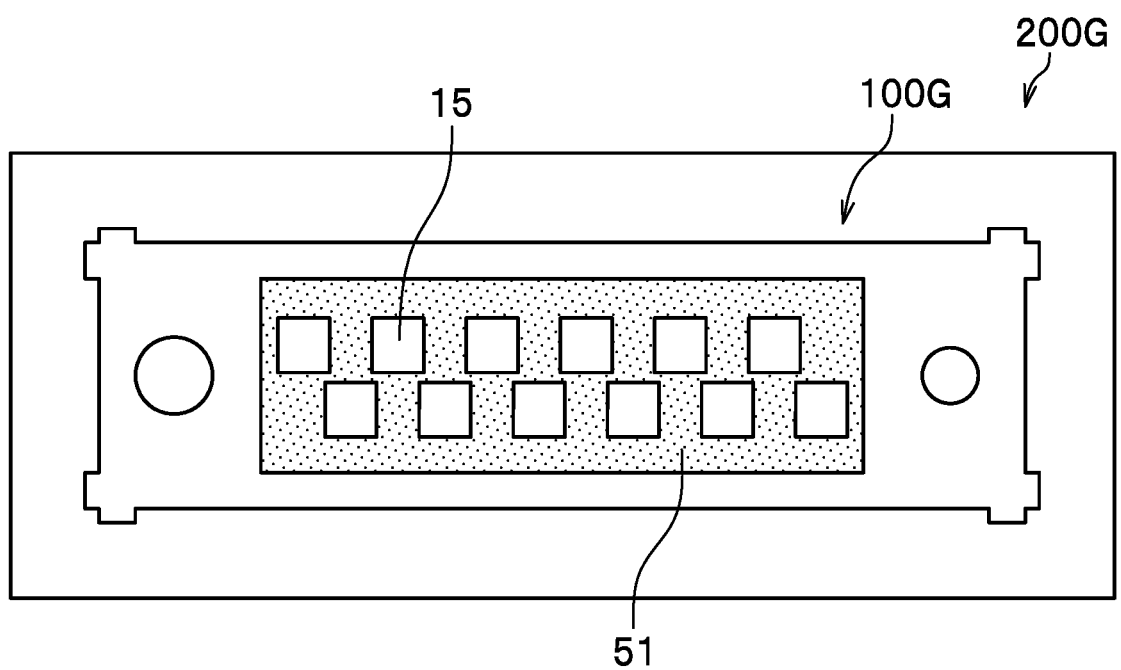
FIG. 5G is a schematic top view illustrating an example of a light emitting module including a light emitting device according to a seventh modification.

A shape of the through holes 60a1 and 60a2 is not limited to a circular shape, and can be an elliptical shape or a polygonal shape such as a triangle and a square. In addition, the through holes 60a1 and 60a2 can be positioned away from the lateral surface(s) of the support member in a top view, or can be open on the lateral surface(s). In other words, the through holes can have a shape such that, in a top view, a portion of an outer edge of the support member is notched in a semi-circular shape, a semi-elliptical shape, and the like. That is, as illustrated in FIG. 5C, through holes 60b1 and 60b2 open on the lateral surface(s) of the support member can be adopted. Sizes of the through holes 60a1 and 60a2 can be appropriately adjusted according to the size and the like of the support member 60. For example, a diameter of the through hole 60a1 is in a range from 1.5 mm to 2.5 mm, and a diameter of the through hole 60a2 is in a range from 0.5 mm to 1.5 mm. If the sizes of the through holes 60a1 and 60a2 are kept within this range, the through holes 60a1 and 60a2 are appropriately large, and thus, can be easily aligned with the holes 80a1 and 80a2 of the module substrate 80, and the through holes 60a1 and 60a2 are appropriately small, and thus, the support member 60 can be increased in strength.

In addition, the support member 60 has an opening 60a3 in a center of the support member 60. In the opening 60a3, the element structural body 15 and the first covering member 51 are disposed. A planar shape of the opening 60a3 is, for example, a substantially rectangular shape longer in the one direction X. The opening 60a3 is preferably dimensioned so that a distance between the plurality of element structural bodies 15 disposed within the opening 60a3 along the one direction X and an inner lateral surface(s) of the opening 60a3 is at least equal to or greater than 0.4 mm. This can facilitate disposition of the element structural body 15 and the first covering member 51 into the opening 60a3. The opening 60a3 preferably passes through the support member 60. As a result, the top surface of the element structural body 15 (that is, the top surface of the light-transmissive member 30) and the bottom surface thereof (that is, the bottom surface of the substrate 10) can be exposed from the support member 60 and the first covering member 51 to allow them to serve as the light emitting surface and an external electrode surface of the light emitting device 100.

The light emitting device 100 includes a plurality of the element structural bodies 15. Here, 11 element structural bodies 15 aligned in a single row along the one direction X are held by the first covering member 51. However, the light emitting device 100 can include 10 or fewer element structural bodies 15, or can include 12 or more element structural bodies 15. However, in the light emitting device 100, at least three element structural bodies 15 are disposed along the one direction X. If three or more element structural bodies 15 are disposed along the one direction X without disposing the support member 60, the light emitting device 100 undergoes shrinkage of the resin during curing of the first covering member 51 at a plurality of places. As the number of joint portions by the first covering member 51 in the one direction X increases, warping of the light emitting device is more likely to occur. In addition, the shrinkage of the resin can occur due to thermal history when mounting the cured light emitting device to the module substrate, and if warping occurs in the light emitting device during the mounting, it is difficult to mount the light emitting device. The light emitting device 100 according to the present embodiment includes the support member 60, and thus, even if three or more element structural bodies 15 are disposed along the one direction X, the light emitting device 100 is suppressed from being warped, and thus, the light emitting device 100 can be precisely disposed at a desired position. In addition, the element structural bodies 15 can be disposed in a plurality of rows along the one direction X. In the present embodiment, the one direction X is a row direction, and a direction perpendicular to the one direction X is a column direction.

"Disposing the element structural bodies 15 along the one direction X" encompasses, in a top view, a case in which the element structural bodies 15 are disposed in parallel so that the upper and lower lateral surfaces of the plurality of element structural bodies 15 are aligned on a straight line, and a case in which the element structural bodies 15 are disposed so that the upper and lower lateral surfaces of adjacent element structural bodies 15 are offset from each other. That is, in the light emitting device, in a top view, it is only required that each of the element structural bodies 15 is partially disposed on the straight line in the one direction X. Preferably, a substantially center of the top surface of each of the element structural bodies 15 is positioned on the straight line in the one direction X. As described below, even if the element structural bodies 15 are disposed in a plurality of rows, it is only required that each of the element structural bodies 15 is partially disposed on each of a plurality of straight lines in the one direction X. Preferably, the top surface of the light-transmissive member 30 of the element structural body 15 is positioned in a matrix along one direction.

In the light emitting device 100 including the plurality of element structural bodies 15, a plurality of light emitting surfaces can be precisely positioned at a desired location in the light emitting device 100 with high density.

Light Emitting Module

Next, the light emitting module 200 will be described.

The light emitting module 200 includes the light emitting device 100 having the above-described configuration, and the module substrate 80 on which the light emitting device 100 is mounted with the substrate 10 of the light emitting device 100 so that the substrate 10 faces the module substrate 80.

If the light emitting device 100 does not include the protecting element 25, a preferable configuration is such that the module substrate 80 includes protecting element 25. Furthermore, the module substrate 80 can be configured to include other electronic components other than the protecting element 25, such as a connector that supplies power to the light emitting device 100.

The light emitting device 100 is configured as described above.

The module substrate 80 is a member on which the light emitting device 100 is mounted and that electrically connects the light emitting device 100 to the outside. The module substrate 80 is substantially rectangular in a top view, for example. The module substrate 80 includes a base member 6 and wiring parts 7 disposed on a surface of the base member 6.

Examples of a material of the base member 6 include the examples described with respect to the material employed in the base 1 of the substrate 10. Examples of a material of the wiring parts 7 include the examples described with respect to the material employed for the wiring of the substrate 10.

The module substrate 80 includes the holes 80a1 and 80a2 that pass through the module substrate 80 at positions facing the through holes 60a1 and 60a2 of the support member 60. The hole 80a1 is substantially the same in shape and size as the through hole 60a1, in a top view, and the hole 80a2 is substantially the same in shape and size as the through hole 60a2 in a top view. The light emitting device 100 is mounted on the top surface of the module substrate 80 so that the through holes 60a1 and 60a2 respectively overlap the holes 80a1 and 80a2. Further, the light emitting device 100 is mounted on the top surface of the module substrate 80 so that the external connection electrodes 3 and the wiring parts 7 are joined via an electrically conductive adhesive 9. Examples of the electrically conductive adhesive 9 include the examples described with respect to the electrically conductive adhesive 8 described above.

In the light emitting module 200, the support member 60 is joined to the module substrate 80 via the electrically conductive adhesive 9. As a result, heat generated from the light emitting device 100 is dissipated to the module substrate 80 via the support member 60. Therefore, the light emitting module 200 has good heat dissipation. The support member 60 can be joined onto the module substrate 80 via an electrically insulating adhesive instead of the electrically conductive adhesive 9. Additionally, the module substrate 80 can be positioned away from or placed on the support member 60 in contact with the support member 60, without the support member 60 being fixed to the module substrate 80.

Operation of Light Emitting Module

When the light emitting module 200 is driven, a current is supplied to the light emitting element 20 from an external power source, and as a result, the light emitting element 20 emits light. Of the light emitted from the light emitting element 20, a portion of light traveling upward is extracted to the outside above the light emitting device 100 via the light-transmissive member 30. Further, light traveling downward is reflected by the substrate 10 or the third covering member 53, and is extracted to the outside of the light emitting device 100 via the light-transmissive member 30. Light traveling in a lateral direction is reflected by at least one of the first covering member 51, the second covering member 52, and the third covering member 53, and extracted to the outside of the light emitting device 100 via the light-transmissive member 30. At this time, if a space between the light-transmissive members 30 is narrowed (for example, narrowed to equal to or less than 0.2 mm), for example, when the light emitting module 200 is employed for a light source of a vehicle headlight, a configuration of an optical system can be simplified and reduced in size. Furthermore, the light emitting module 200 has good heat dissipation and can be suppressed from deforming due to heat because of a presence of the support member 60.

Method of Manufacturing Light Emitting Device

Figure 2:
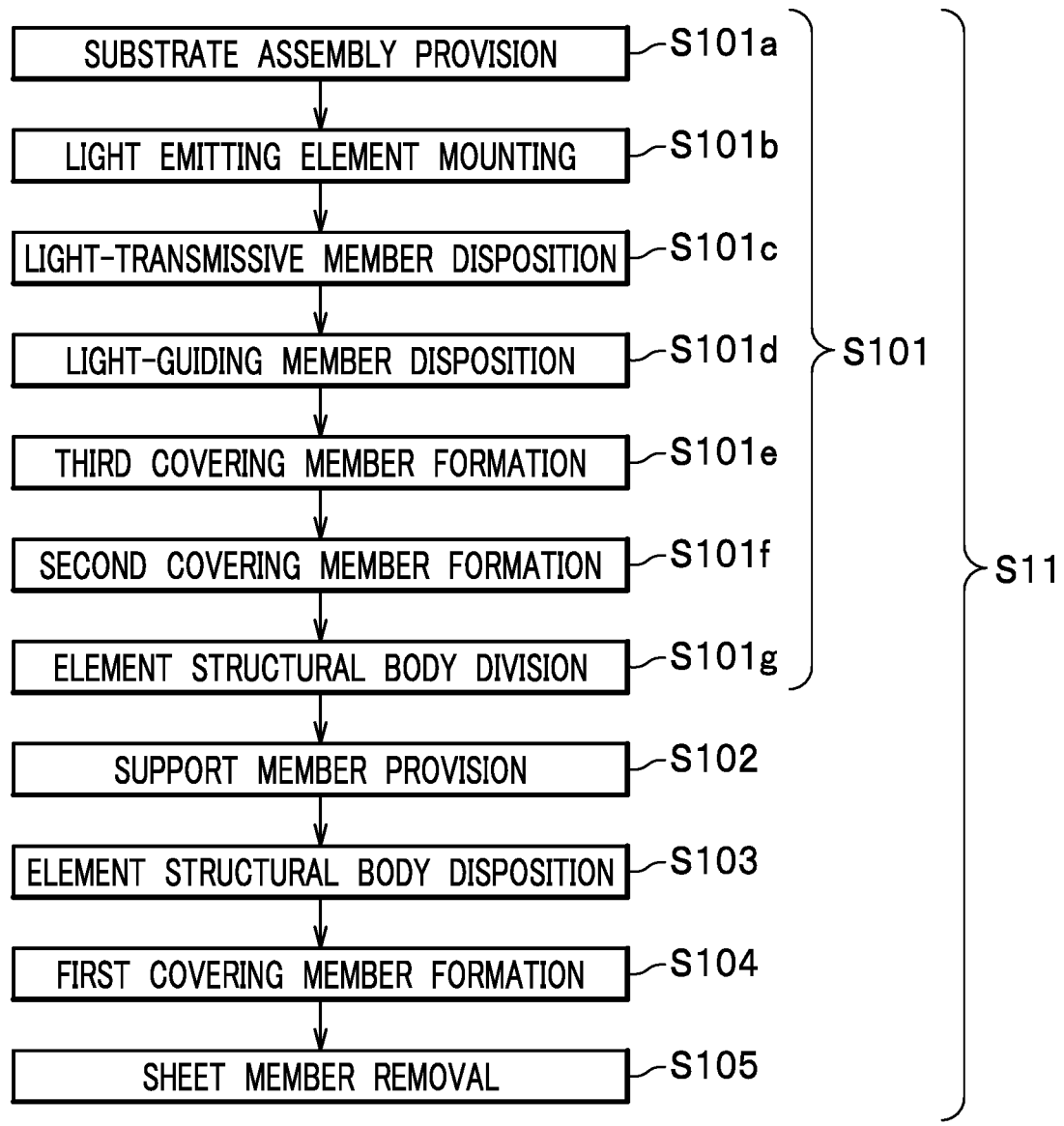
FIG. 2 is a flowchart of a method of manufacturing the light emitting device according to the embodiment.

First, an example of a method of manufacturing the light emitting device 100 will be described. FIG. 2 is a flowchart of a method of manufacturing the light emitting device 100 according to the embodiment.

The method of manufacturing the light emitting device 100 includes an element structural body provision step S101, a support member provision step S102, an element structural body disposition step S103, a first covering member formation step S104, and a sheet member removal step S105.

The material, arrangement, and the like of each of the members are as in the description of the light emitting device 100, and thus descriptions thereof will be omitted as appropriate.

Element Structural Body Provision Step

The element structural body provision step S101 is a step of providing a plurality of the element structural bodies 15 each including the substrate 10, the light emitting element 20, the light-transmissive member 30, the light-guiding member 40, the third covering member 53, and the second covering member 52.

The plurality of element structural bodies 15 can be provided by being purchased, for example, or provided by preparing the substrate 10, the light emitting element 20, the light-transmissive member 30, the light-guiding member 40, the third covering member 53, and the second covering member 52 and then going through some or all of the steps described below.

The element structural body provision step S101 includes, for example, a substrate assembly provision step S101a, a light emitting element mounting step S101b, a light-transmissive member disposition step S101c, a light-guiding member disposition step S101d, a third covering member formation step S101e, a second covering member formation step S101f, and an element structural body division step S101g.

Substrate Assembly Provision Step

The substrate assembly provision step S101a is a step of providing a substrate assembly 11 including a plurality of first regions 12 serving as the substrates 10 after the substrate assembly 11 is divided.

Figure 4A:
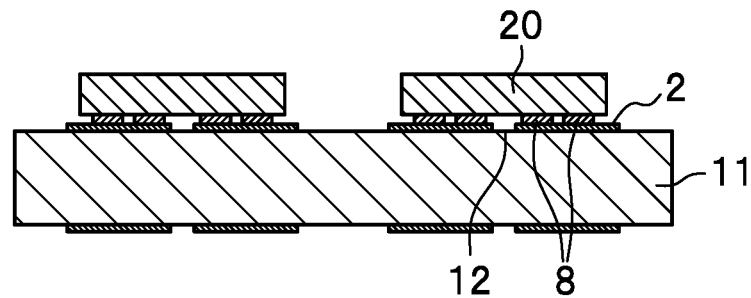
FIG. 4A is a schematic cross-sectional view illustrating an example of the method of manufacturing the light emitting device according to the embodiment.
Figure 4B:
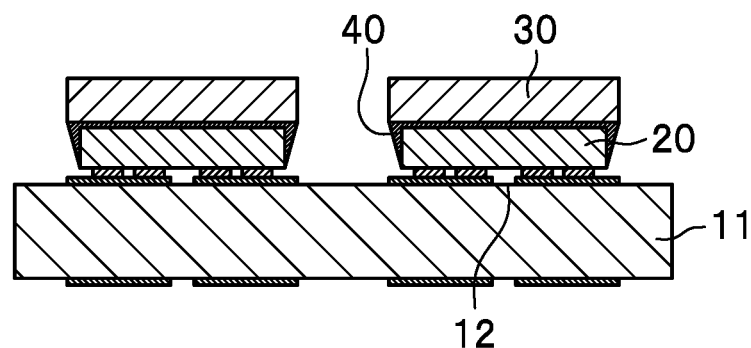
FIG. 4B is a schematic cross-sectional view illustrating an example of the method of manufacturing the light emitting device according to the embodiment.

The substrate assembly 11 is a single substrate including the plurality of first regions 12 on which the light emitting element 20 is mounted. In FIG. 4A, for convenience, the substrate assembly 11 including two of the first regions 12 is illustrated, but the number of the first regions 12 can be adjusted as appropriate.

Light Emitting Element Mounting Step

FIG. 4A is a schematic cross-sectional view illustrating a step of mounting the light emitting element.

The light emitting element mounting step S101b is a step of mounting the light emitting elements 20 in the plurality of first regions 12.

In the step S101b, each of a plurality of the light emitting elements 20 is mounted in each of the plurality of first regions 12. The mounting surface of the light emitting element 20 is a surface on which an electrode is formed, and the light emitting element 20 is flip-chip mounted on the top surface wiring 2 disposed in each of the first regions 12 by the electrically conductive adhesive 8.

The light emitting element 20 can be provided through some or all of the manufacturing steps, such as through a step of growing a semiconductor, or can be purchased and provided.

The step S101b includes a step of mounting the protecting elements 25 in the plurality of first regions 12. That is, in the step S101b, each of the plurality of protecting elements 25 is mounted in each of the plurality of first regions 12.

Light-Transmissive Member Disposition Step

FIG. 4A is a schematic cross-sectional view illustrating a step of disposing the light-transmissive member.

The light-transmissive member disposition step S101c is a step of disposing the light-transmissive member 30 above each of the light emitting elements 20.

In the step S101c, for example, the light-transmissive member 30 having a predetermined shape is joined to a top surface opposite to an electrode formation surface of the light emitting element 20 (that is, on a primary light extraction side).

In the step S101c, for example, the light-transmissive member 30 is disposed on the light emitting element 20 disposed with a light-transmissive adhesive member thereon. As a result, the light-transmissive member 30 is joined to the top surface of the light emitting element 20 via the adhesive member. As described below, the adhesive member is pressed by the light-transmissive member 30 to form the light-guiding member 40 having a predetermined thickness. The bottom surface of the light-transmissive member 30 is preferably wider than the top surface of the light emitting element 20. As a result, the adhesive member can easily extend to the lateral surface of the light emitting element 20. The light-transmissive member 30 can be mounted on the light emitting element 20 so that the adhesive member is disposed on the light-transmissive member 30, after which the adhesive member on the light-transmissive member 30 is disposed on the top surface of the light emitting element 20.

When the light-transmissive member 30 is joined to the light emitting element 20, a direct joint method can be employed without using the adhesive member.

Light-Guiding Member Disposition Step

The light-guiding member disposition step S101d is a step of disposing the light-guiding member 40 to the lateral surface(s) of each of the light emitting elements 20.

The light-guiding member disposition step S101d can be performed as the same step as the light-transmissive member disposition step S101c. An amount and a viscosity of the adhesive member used in the light-transmissive member disposition step S101c can be adjusted. This can form the light-guiding member 40 by extending the adhesive member disposed between the light emitting element 20 and the light-transmissive member 30 to the lateral surface(s) of the light emitting element 20.

If the light-transmissive member disposition step S101c is followed by the light-guiding member disposition step S101d, the light-guiding member 40 is disposed on the lateral surface(s) of the light emitting element 20 after the light emitting element 20 and the light-transmissive member 30 are joined by using the adhesive member or by a direct joint method.

If a light-transmissive adhesive member for joining the light emitting element 20 and the light-transmissive member 30 is employed for the light-guiding member 40 in the light-transmissive member disposition step S101c, the light-transmissive member disposition step S101c and the light-guiding member disposition step S101d are preferably performed as the same step. This can simplify the steps.

Third Covering Member Formation Step

Figure 4C:
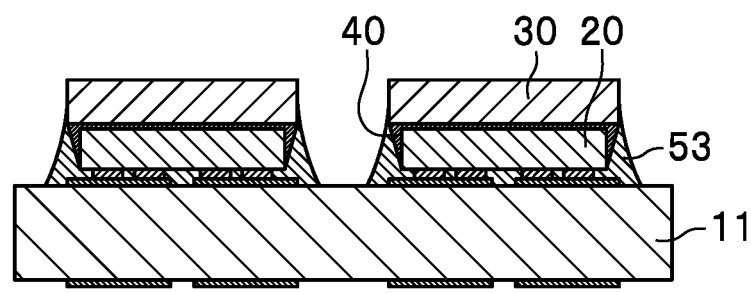
FIG. 4C is a schematic cross-sectional view illustrating an example of the method of manufacturing the light emitting device according to the embodiment.

FIG. 4C is a schematic cross-sectional view illustrating a step of forming the third covering member.

The third covering member formation step S101e is a step of forming the third covering member 53 that covers the lateral surface(s) of each of the light emitting elements 20, onto the substrate assembly 11.

In the step S101e, via the light-guiding member 40 disposed on the lateral surface(s) of the light emitting element 20, the third covering member 53 that covers the lateral surface(s) of each of the light emitting elements 20 is formed on the substrate assembly 11. In addition, the third covering member 53 can also be disposed between the light emitting element 20 and the substrate assembly 11, and in the step S101e, the third covering member 53 is preferably provided so as to cover the bottom surface of each of the light emitting elements 20.

In the step S101e, an uncured resin to be the third covering member 53 is applied onto the substrate assembly 11 by potting, spraying, and the like. If there is a gap between the light emitting element 20 and the substrate assembly 11, the resin applied on the substrate assembly 11 spreads into the gap and creeps up and covers the lateral surface(s) of the light emitting element 20 and/or the light guide member 40. Thereafter, the resin is cured to form the third covering member 53 that covers the lateral surface(s) of the light emitting element 20.

Second Covering Member Formation Step

Figure 4D:
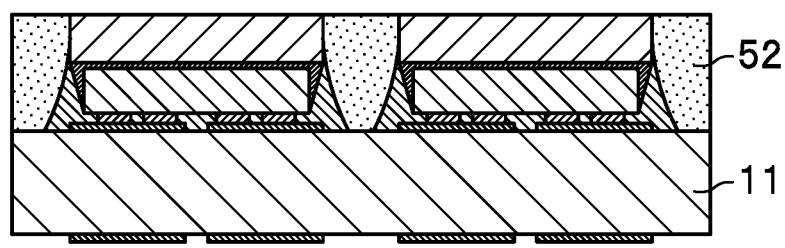
FIG. 4D is a schematic cross-sectional view illustrating an example of the method of manufacturing the light emitting device according to the embodiment.

FIG. 4D is a schematic cross-sectional view illustrating a step of forming the second covering member.

The second covering member formation step S101f is a step forming the second covering member 52 that covers the lateral surface(s) of each of the light emitting elements 20 and the lateral surface(s) of each of the light-transmissive members 30, on the substrate assembly 11.

In the step S101f, the lateral surface(s) of each of the light emitting elements 20 is covered via the light-guiding member 40 disposed on the lateral surface(s) of the light emitting element 20, and the second covering member 52 that covers the lateral surface(s) of each of the light-transmissive members 30 is formed on the substrate assembly 11.

In the step S101f, an uncured resin to be the second covering member 52 is applied onto the substrate assembly 11 by potting, spraying, and the like. The resin applied on the substrate assembly 11 creeps up and covers the lateral surface(s) of the light emitting element 20, the light guide member 40, and/or the light-transmissive member 30 by a surface tension. Thereafter, the resin is cured to from the second covering member 52 that covers the lateral surface(s) of the light emitting element 20 and the lateral surface(s) of the light-transmissive member 30.

In the step S101f, the second covering member 52 is formed so that the lateral surface(s) of the light emitting element 20 and the lateral surface(s) of the light-transmissive member 30 are covered and the top surface of the light-transmissive member 30 is exposed. The second covering member 52 can be formed by injection molding, transfer molding, compression molding, and the like by using a mold and the like. Formation of the second covering member 52 can be performed by covering the top surface of the light-transmissive member 30 and thereafter removing a part of the second covering member 52 by polishing, grounding, and severing, for example, so that the top surface of the light-transmissive member 30 is exposed.

Element Structural Body Division Step

Figure 4E:
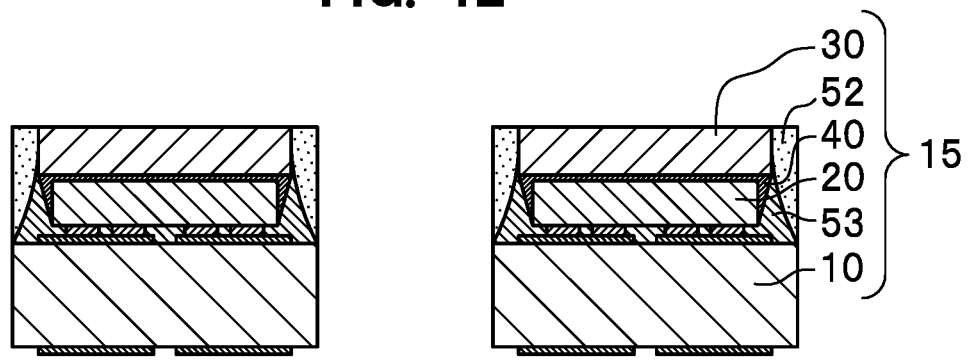
FIG. 4E is a schematic cross-sectional view illustrating an example of the method of manufacturing the light emitting device according to the embodiment.

FIG. 4E is a schematic cross-sectional view illustrating a step of individualizing the element structural body.

The element structural body division step S101g is a step of dividing the substrate assembly 11 into each of the first regions 12 to obtain a plurality of the element structural bodies 15.

In the step S101g, the substrate assembly 11 is divided at predetermined positions to achieve the plurality of element structural bodies 15.

In the method of manufacturing the light emitting device 100, the plurality of divided element structural bodies 15 are combined to manufacture the light emitting device 100. That is, a sorting step can be performed after the division into each of the element structural bodies 15, and thus, the light emitting device 100 can be formed in such a way that an element structural body 15 having a light emitting property within a predetermined range is sorted from the divided element structural bodies 15, after which the divided element structural bodies 15 are combined as desired. As a result, the light emitting device 100 providing a desired light emission color with little color deviation can be obtained.

In addition, each of the element structural bodies 15 includes the third covering member 53, and thus, even if a light emission color of the element structural body 15 and a light emission color of the light emitting element 20 differ from each other, such as in a case in which the light-transmissive member 30 includes a wavelength conversion member, only the element structural body 15 having a light emitting property within a predetermined range can be easily sorted.

In addition, in the manufacturing process, when a defect occurs in some of the element structural bodies 15, only the defective element structural body 15 can be discarded before the first covering member 51 is disposed. In a light emitting device in which a plurality of light emitting elements are mounted on a single substrate, when a defect occurs in some of the members, the entire light emitting device needs to be discarded. Therefore, the method of manufacturing the light emitting device according to the present embodiment allows for reduction of an amount of waste members when a defect occurs during the step.

Support Member Provision Step

Figure 4F:
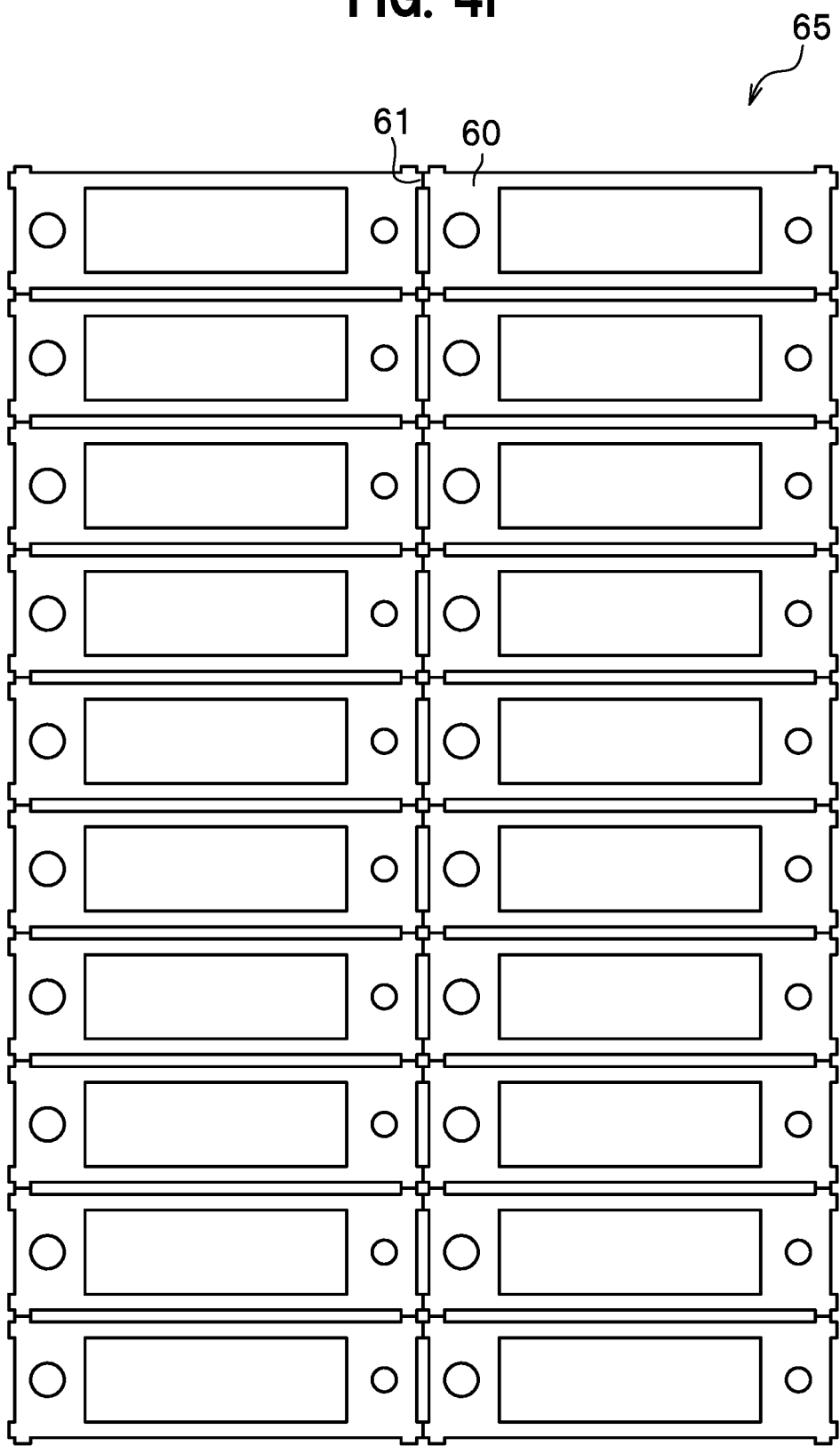
FIG. 4F is a schematic top view illustrating an example of the method of manufacturing the light emitting device according to the embodiment.
Figure 4G:
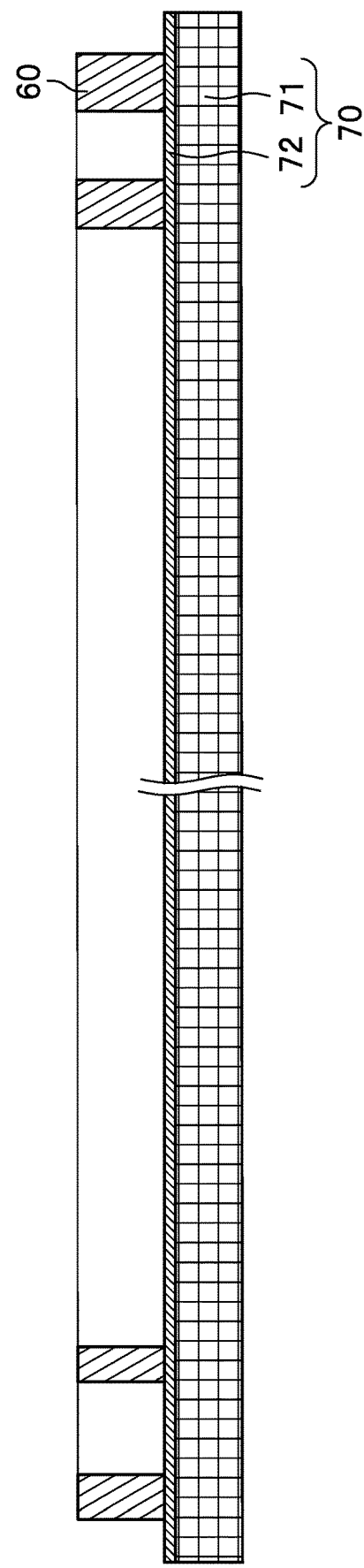
FIG. 4G is a schematic cross-sectional view illustrating an example of the method of manufacturing the light emitting device according to the embodiment.

FIG. 4F is a schematic top view illustrating a support member assembly in a support member provision step. FIG. 4G is a schematic cross-sectional view illustrating a state in which the support member is disposed on a sheet member.

The support member provision step S102 is a step of providing the support member 60.

As illustrated in FIG. 4F, the support member 60 can be provided as a support member assembly 65 in which, for example, the frame-shaped support member 60 having the opening 60a3 is connected in a matrix with a link member 61.

As illustrated in FIG. 4G, when the support member assembly 65 is fixed on the sheet member 70, for example, the element structural bodies 15 can be mounted on the sheet member 70, based on the position of the support member 60. As a result, the element structural body 15 can be precisely mounted on the sheet member 70 even without an alignment mark for mounting the element structural body 15. Additionally, using the support member 60 having the through holes 60a1 and 60a2 different in diameter can suppress erroneous recognition in the left and right directions of the support member assembly 65. In FIG. 4G, for convenience, a state in which one support member 60 is disposed on the sheet member 70 is illustrated.

Element Structural Body Disposition Step

FIG. 4H is a schematic cross-sectional view illustrating a step of disposing the element structural body on a sheet. In FIG. 4H, for convenience, the element structural bodies 15 disposed on one support member 60 is illustrated.

The element structural body disposition step S103 is a step of disposing the plurality of element structural bodies 15 on the sheet member 70 so that the substrate 10 of each of the element structural bodies 15 faces the sheet member 70.

In the step S102, the plurality of element structural bodies 15 are disposed along the one direction X within the opening 60a3 of the frame-shaped support member 60 having the opening 60a3. The plurality of element structural bodies 15 are mounted on the sheet member 70 so that the bottom surface of the substrate 10 (that is, a surface opposite the surface on which the light emitting element 20 is mounted) contacts the top surface of the sheet member 70. In the sheet member 70, an adhesive agent 72 is provided on a support 71. In a case in which the element structural body 15 includes the external connection electrode 3 on the bottom surface, the element structural body 15 is preferably disposed on the sheet member 70 to press the bottom surface into the adhesive agent 72 so that the external connection electrode 3 is embedded in the adhesive agent 72 of the sheet member 70. As a result, in the first covering member formation step S104 described below, intrusion of the first covering member 51 to the surface of the external connection electrode 3 can be suppressed.

In the step S102, the divided element structural bodies 15 can be disposed on the sheet member 70, and thus, for example, if a blade is used for division, the element structural bodies 15 can be disposed at a distance shorter than a width of the blade. As a result, the light emitting device 100 having a narrow space between the light emitting surfaces can be provided. In addition, in the step S102, the divided element structural bodies 15 are disposed on the sheet member 70, and thus, the plurality of light emitting surfaces can be precisely positioned at a desired location within a frame of the support member 60 with high density.

Examples of the sheet member 70 include a heat-resistant resin sheet and a UV cured sheet, known in the art.

First Covering Member Formation Step

FIG. 4I is a schematic cross-sectional view illustrating a step of forming the first covering member.

The first covering member formation step S104 is a step of forming the first covering member 51 on the sheet member 70 exposed from the opening 60a3. The first cover member 51 covers lateral surface(s) of the substrate 10, the light emitting element 20, and the light-transmissive member 30 of each of the element structural bodies 15.

In the step S104, an uncured resin to be the first covering member 51 is disposed on the sheet member 70 so that the first covering member 51 is provided up to the lateral surface(s) of the element structural bodies 15 in the frame of the support member 60 by potting or spraying, for example. The resin disposed within the opening 60a3 creeps up a space between the adjacent element structural bodies 15 due to a capillary action. As a result, the lateral surface(s) of the light-transmissive member 30 of the element structural body 15 can be covered. In the case in which the height of the top surface of the support member 60 disposed on the sheet member 70 is made lower than the top surface of the element structural body 15, creeping of the first covering member 51 onto the top surface of the light-transmissive member 30 can be suppressed.

In the step S104, the first covering member 51 is provided so that the lateral surface(s) of the element structural body 15 (that is, the lateral surface(s) of the substrate 10, the lateral surface(s) of the light emitting element 20, and the lateral surface(s) of the light-transmissive member 30) are covered and the top surface of the light-transmissive member 30 is exposed. The first covering member 51 can be disposed so that the top surface of the element structural body 15 is covered, after which a part of the first covering member 51 is removed by being polished, ground, or severed, for example, so that the top surface of the element structural body 15 is exposed.

Note that the first covering member 51 can be formed by molding, printing, or the like.

Sheet Member Removal Step

Figure 4J:
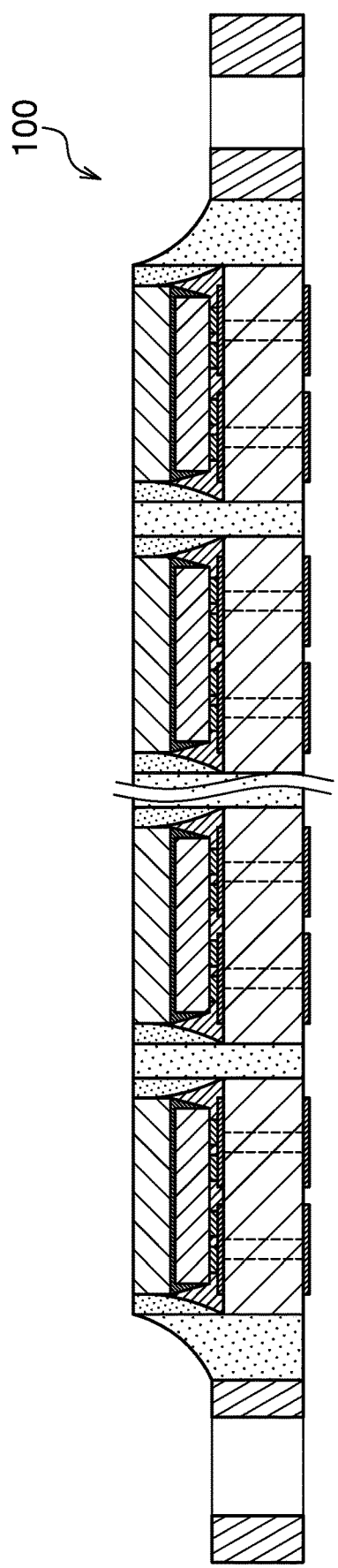
FIG. 4J is a schematic cross-sectional view illustrating an example of the method of manufacturing the light emitting device according to the embodiment.

FIG. 4J is a schematic cross-sectional view illustrating a step of removing the sheet member. The sheet member removal step S105 is a step of removing the sheet member 70.

In the step S105, the sheet member 70 on which the element structural body 15 and the like is mounted is peeled off to form the light emitting device 100.

I practice, the light emitting devices 100 are linked with each other with the link member 61 of the support member assembly 65, and the link member 61 is cut to obtain individual light emitting devices 100.

The light emitting device 100 thus obtained has a narrow space between the light emitting surfaces, and thus, coordination of a light distribution by an optical system such as a lens is facilitated. Additionally, the plurality of light emitting surfaces can be disposed precisely at a desired position in the light emitting device 100 with high density. In addition, the light emitting device 100 is suppressed from being warped, and thus, the light emitting device 100 can be precisely disposed at a desired position of the module substrate 80.

Method of Manufacturing Light Emitting Module

Figure 3:
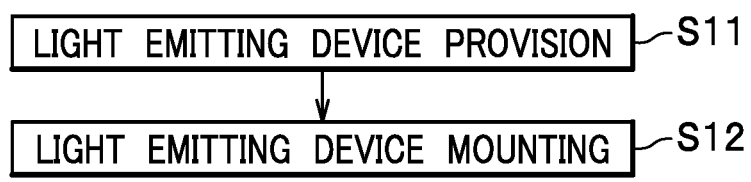
FIG. 3 is a flowchart of a method of manufacturing the light emitting module according to the embodiment.

Next, an example of a method of manufacturing the light emitting module 200 will be described. FIG. 3 is a flowchart of the method of manufacturing the light emitting module according to the embodiment.

The method of manufacturing the light emitting module 200 includes a light emitting device provision step S11 and a light emitting device mounting step S12.

Figure 4K:
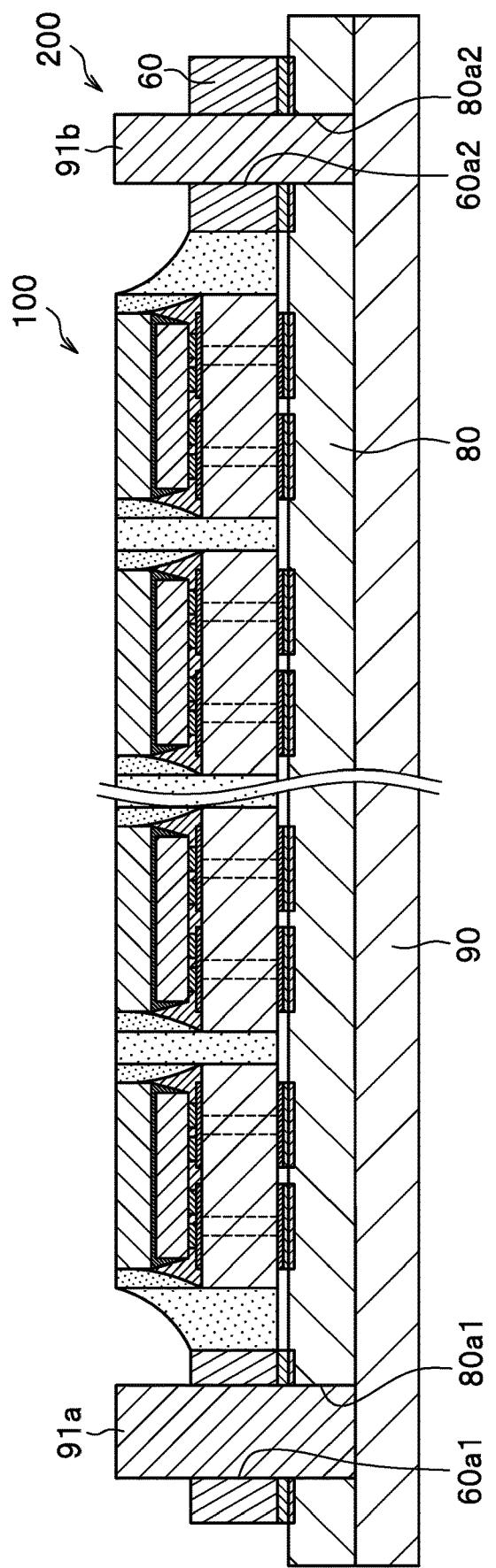
FIG. 4K is a schematic cross-sectional view illustrating an example of the method of manufacturing the light emitting module according to the embodiment.

The module substrate 80 preferably has the holes 80a1 and 80a2 at positions respectively facing the through holes 60a1 and 60a2 of the support member 60. As illustrated in FIG. 4K, in the light emitting device mounting step S12, the through holes 60a1 and 60a2 of the support member 60 are aligned with the holes 80a1 and 80a2 of the module substrate 80 to mount the light emitting device 100 on the module substrate 80.

The material, arrangement, and the like of each of the members are as in the description of the light emitting module 200, and thus descriptions thereof will be omitted as appropriate.

Light Emitting Device Provision Step

The light emitting device provision step S11 is a step of providing the above-described light emitting device 100.

In the step S11, the light emitting device 100 is manufactured by, for example, performing the above-described steps S101 to S105.

Light Emitting Device Mounting Step

FIG. 4K is a schematic cross-sectional view illustrating a step of mounting the light emitting device.

The light emitting device mounting step S12 is a step of mounting the light emitting device 100 so that the substrate 10 of the light emitting device 100 faces the module substrate 80.

In the step S12, the light emitting device 100 is mounted on the top surface of the module substrate 80. In the light emitting device 100, a side closer to the substrate 10 is a mount surface, and the light emitting device 100 is mounted on the top surface of the module substrate 80 via the electrically conductive adhesive 9.

In the step S12, the through hole 60a1 of the support member 60 is aligned with the hole 80a1 of the module substrate 80 and the through hole 60a2 of the support member 60 is aligned with the hole 80a2 of the module substrate 80, and fastener 91a of positioning jigs 90 is inserted into the through hole 60a1 and the hole 80a1 and fastener 91b is inserted into the through hole 60a2 and the hole 80a2. Thus, the light emitting device 100 is aligned with the module substrate 80 to mount the light emitting device 100 on the module substrate 80.

Thus, the light emitting device and the light emitting module, and the method of manufacturing the light emitting device and the method of manufacturing the light emitting module have been specifically described in DESCRIPTION OF EMBODIMENTS, but the spirit of the present invention is not limited to these descriptions, and should be broadly construed based on the claims. Various modifications, variations, and the like based on these descriptions are also included within the spirit of the present invention.

Modifications

Figure 5H:
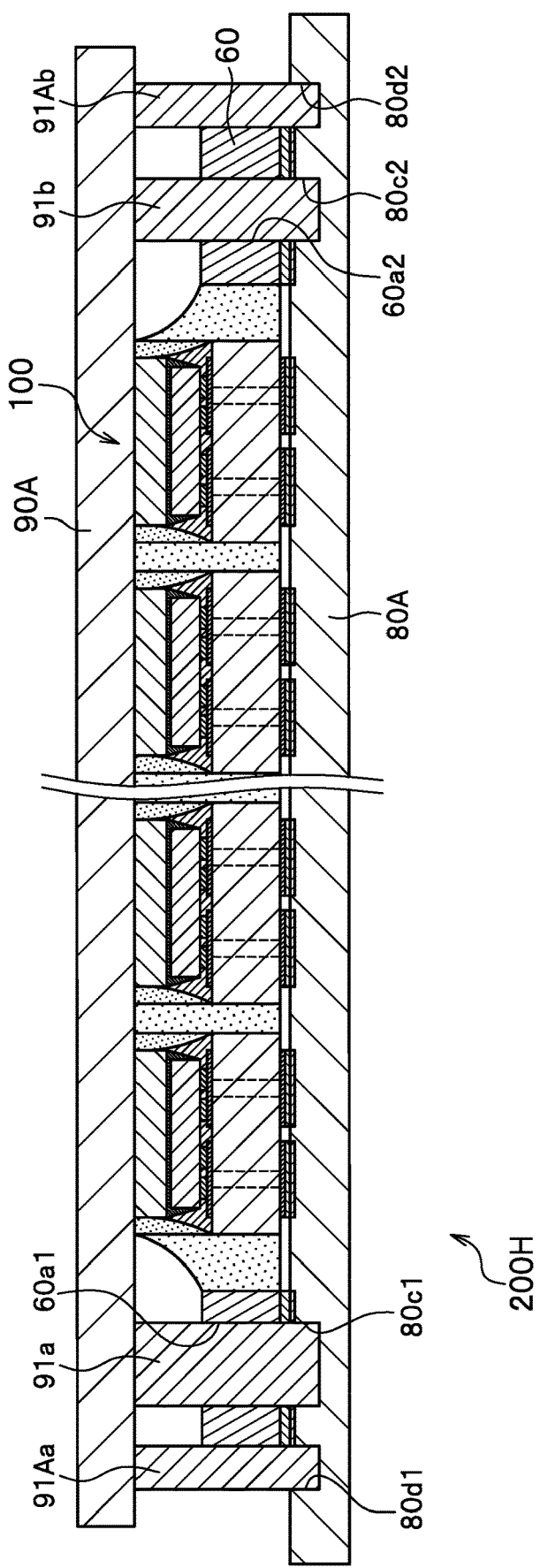
FIG. 5H is a schematic cross-sectional view illustrating an example of the method of manufacturing a light emitting module according to an eighth modification.

FIGS. 5A to 5G are schematic top views each illustrating an example of a light emitting module including a light emitting device according to a first modification to a seventh modification. FIG. 5H is a schematic cross-sectional view illustrating an example of a method of manufacturing a light emitting module according to an eighth modification.

In each of the drawings, the size, the positional relationship, and the like of the members are simplified as appropriate.

In the first modification, in a light emitting module 200A and a light emitting device 100A, a support member 60A is a single bar-shaped member. The bar-shaped support member 60A is disposed along the side of the plurality of element structural bodies 15 in the one direction X.

In the second modification, in a light emitting module 200B and a light emitting device 100B, a support member 60B includes two bar-shaped support members 60B. The two support members 60B are disposed in parallel along the sides of the plurality of element structural bodies 15 in the one direction X so that the bar-shaped support members 60B sandwich the plurality of element structural bodies 15.

As illustrated in the first modification and the second modification, even if the bar-shaped support member is employed in the light emitting device, using the configuration in which the support members are disposed along the sides of the plurality of element structural bodies 15 in the one direction X can suppress warping of the light emitting device. Furthermore, if the bar-shaped support member is employed, the support member can be reduced in size, and thus, the light emitting modules 200A and 200B and the light emitting devices 100A and 100B can be reduced in size and weight. In the first modification and the second modification, the support member may have or may not have a through hole to be aligned with the module substrate.

In the third modification, in a light emitting module 200C and a light emitting device 100C, a support member 60C includes the through holes 60b1 and 60b2 having a shape obtained by partially cutting an external edge in a semi-elliptical shape, at both lateral surface(s)s facing in the one direction X. The through holes 60b1 and 60b2 differ in size. In this manner, if the through holes 60b1 and 60b2 are through holes open on the lateral surface(s), a length in the one direction X of the support member 60C can be shortened, and thus, the light emitting module 200C and the light emitting device 100C can be reduced in size and weight. The shapes of the through holes 60b1 and 60b2 open on the lateral surface(s) are not limited to a semi-elliptical shape, and can be a semicircular shape or a quadrangular shape.

In the fourth modification, in a light emitting module 200D and a light emitting device 100D, a plurality of the element structural bodies 15 are disposed in a matrix of 2 rows and 11 columns. In the fifth modification, in a light emitting module 200E and a light emitting device 100E, a plurality of the element structural bodies 15 are disposed in a matrix of 2 rows and 11 columns. In the fifth modification, the element structural bodies 15 located at both ends of each row are disposed so that a distance from the element structural body 15 at one end to the adjacent element structural body 15 in a row direction is longer than a distance between the other element structural bodies 15 in the row direction.

In the sixth modification, in a light emitting module 200F and a light emitting device 100F, the element structural bodies 15 that are different in a size of the light emitting surface are combined. In this modification, the element structural bodies 15 having small light emitting surfaces are disposed in a matrix of two rows and six columns at a center portion of the light emitting device 100F. In addition, the three element structural bodies 15 having large light emitting surfaces are each disposed in line at both ends in the row direction of an assembly of the element structural bodies 15 having small light emitting surfaces. In this manner, in the light emitting module 200F and the light emitting device 100F, the plurality of element structural bodies 15 different in light emitting surface are disposed along the one direction. In this manner, in the light emitting module 200 and the light emitting device 100, some of the plurality of element structural bodies 15 can be disposed in a plurality of rows while being disposed along the one direction. In the light emitting module 200F and the light emitting device 100F, in the case in which the element structural body 15 having a small light emitting surface is disposed at the center portion, a large number of element structural bodies 15 can be densely disposed at the center portion, as compared to a case in which the element structural body 15 having a large light emitting surface is disposed. In the light emitting module 200F and the light emitting device 100F, in the case in which the element structural bodies 15 are densely disposed at the center portion, in a case in which the light emitting module 200F is employed for a light source of a vehicle headlight, for example, it is possible to emit light onto the center portion (mainly, on a road) with higher definition.

In the seventh modification, in a light emitting module 200G and a light emitting device 100G, the element structural bodies 15 are disposed in two rows in a staggered pattern. In this modification, the element structural bodies 15 in the first row and the element structural bodies 15 in the second row are disposed to be shifted in a row direction so that a gap in the row direction between the element structural bodies 15 in the first row and the element structural bodies 15 in the second row is equal to or less than 0. In this manner, in the light emitting module 200G and the light emitting device 100G, the plurality of element structural bodies 15 are disposed in two rows along the one direction. In the light emitting module 200G and the light emitting device 100G, the gap in the row direction can be equal to or less than 0, for example, in a case in which the light emitting module 200G is employed for a light source of a vehicle headlight, it is possible to emit light in a lateral direction with higher definition.

Thus, in the light emitting module and the light emitting device, the number of rows and the number of columns are not limited, and the number of element structural bodies in each row and each column can be adjusted as appropriate in accordance with a desired light distribution pattern. Furthermore, in the light emitting module and the light emitting device, a combination of element structural bodies different in size of the light emitting surface, a disposition of the element structural bodies, or the like can be adjusted as appropriate in accordance with a light distribution pattern.

In the light emitting device, the plurality of element structural bodies can include at least two types of element structural bodies different in light emission color. Here, the light emission color of the element structural body refers to an emission color of the light emitted from the top surface of the light-transmissive member. For example, the light emitting element and the element structural body can be the same in light emission color. If light emitting elements different in light emission color are employed, for example, at least two types of element structural bodies having different light emission colors can be obtained. In addition, if the plurality of element structural bodies using the light emitting elements same in light emission color include the light-transmissive members containing phosphors different from each other, the plurality of element structural bodies different in light emission color can be obtained.

In the light emitting device and the light emitting module described above, the second covering member may or may not cover the bottom surface of the light emitting element.

Furthermore, various types of colorants, fillers, wavelength conversion members, or the like serving as an additive can be contained in each member of the first covering member, the second covering member, the third covering member, the light-guiding member, and the like to obtain a desired light emission color, a desired color of a surface of a member, a desired light distribution characteristic, or the like.

Additionally, the substrate and the module substrate can be a substantially square in a top view, and the support member can also be a substantially square frame body in a top view. The substrate, the module substrate, and the support member can be formed in other shapes. In addition, if the support member is a frame body, the frame can include an intermittently disposed portion. The support member can be formed in a shape in which one side of a polygon is missing (for example, a concave shape), a U shape, and the like, for example.

In the eighth modification, a light emitting module 200H includes the light emitting device 100 and a module substrate 80A. The module substrate 80A has holes 80$c$1 and 80$c$2 at positions respectively facing the through holes 60$a$1 and 60$a$2 of the support member 60. Additionally, the module substrate 80A has holes 80$d$1 an 80$d$2 into which fasteners 91Aa and 91Ab of positioning jigs 90A are inserted. In the eighth modification, the holes 80$c$1 and 80$c$2 and the holes 80$d$1 and 80$d$2 are holes that are provided on the top surface of the module substrate 80A and do not pass through the module substrate 80A.

In the light emitting device mounting step S12, the through hole 60$a$1 of the support member 60 is aligned with the hole 80$c$1 of the module substrate 80A, and the through hole 60$a$2 of the support member 60 is aligned with the hole 80$a$2 of the module substrate 80A, and the fasteners 91$a$ of the positioning jigs 90A are inserted into the through hole 60$a$1 and the hole 80$c$1, and the fastener 91$b$ is inserted into the through hole 60$a$2 and the hole 80$c$2. The fastener 91Aa is inserted into the hole 80$d$1, and the fastener 91Ab is inserted into the hole 80$d$2. Thus, the light emitting device 100 is aligned with the module substrate 80A to mount the light emitting device 100 on the module substrate 80A.

Figure 6A:
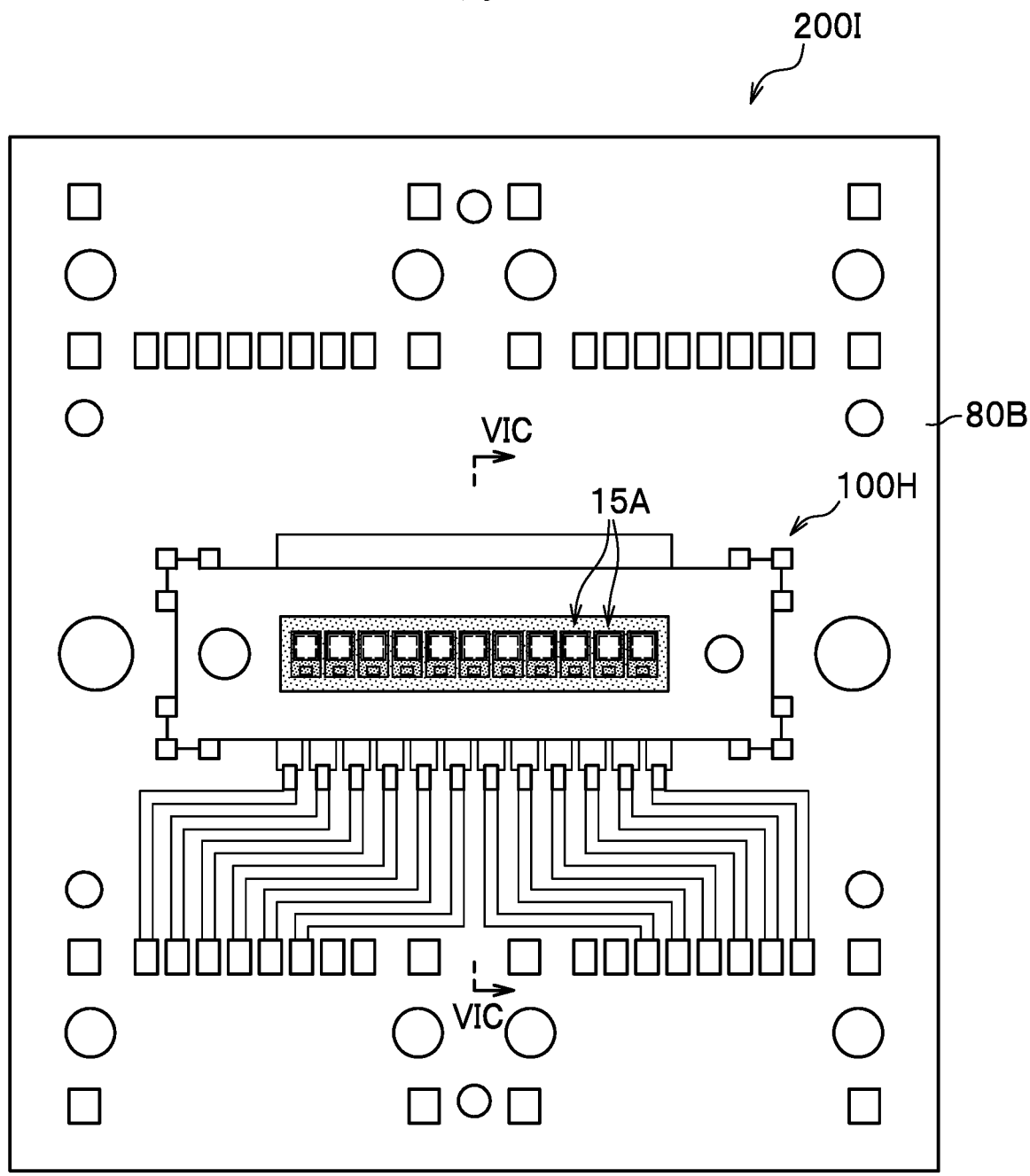
FIG. 6A is a schematic top view illustrating an example of a light emitting module including a light emitting device according to a ninth modification.
Figure 6B:
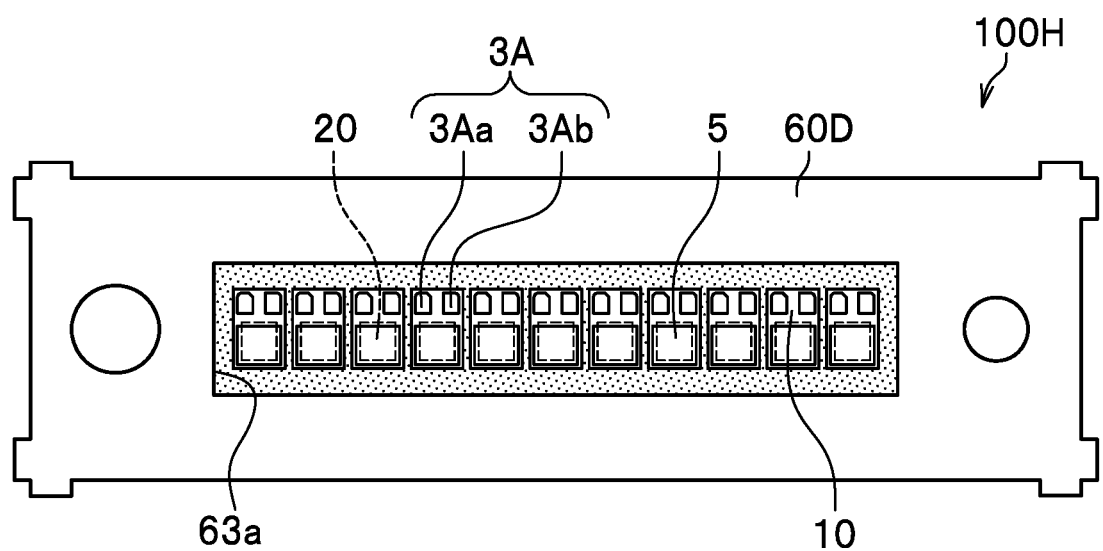
FIG. 6B is a schematic bottom view illustrating an example of the light emitting device according to the ninth modification.
Figure 6C:
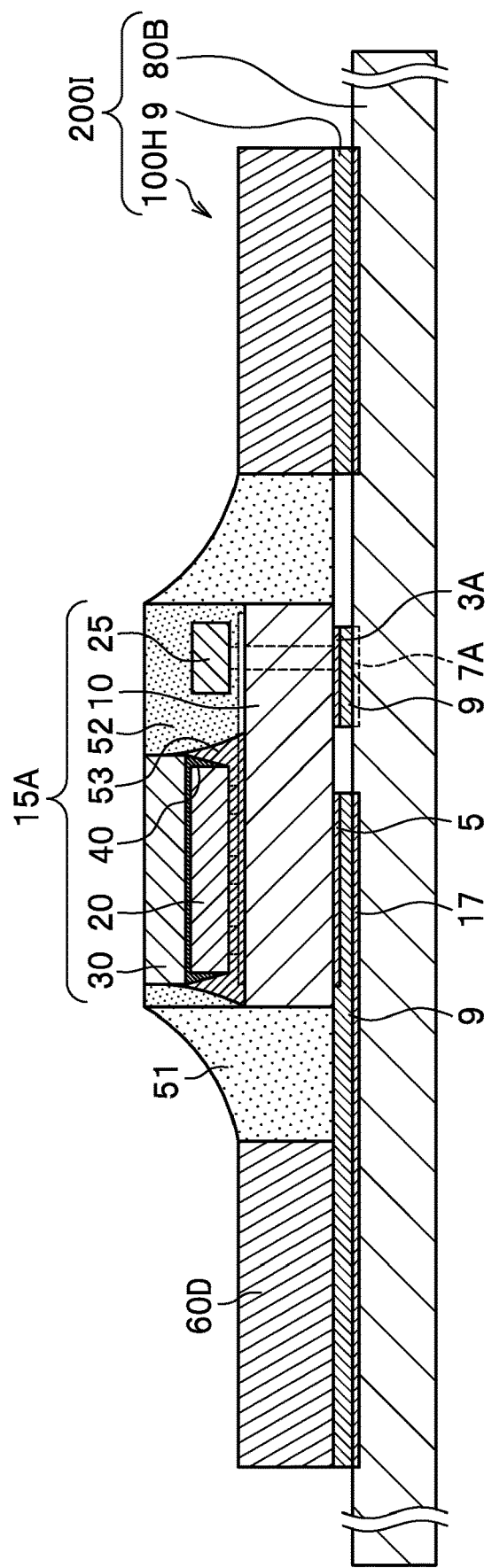
FIG. 6C is a schematic cross-sectional view taken along line VIC-VIC of FIG. 6A.
Figure 6D:
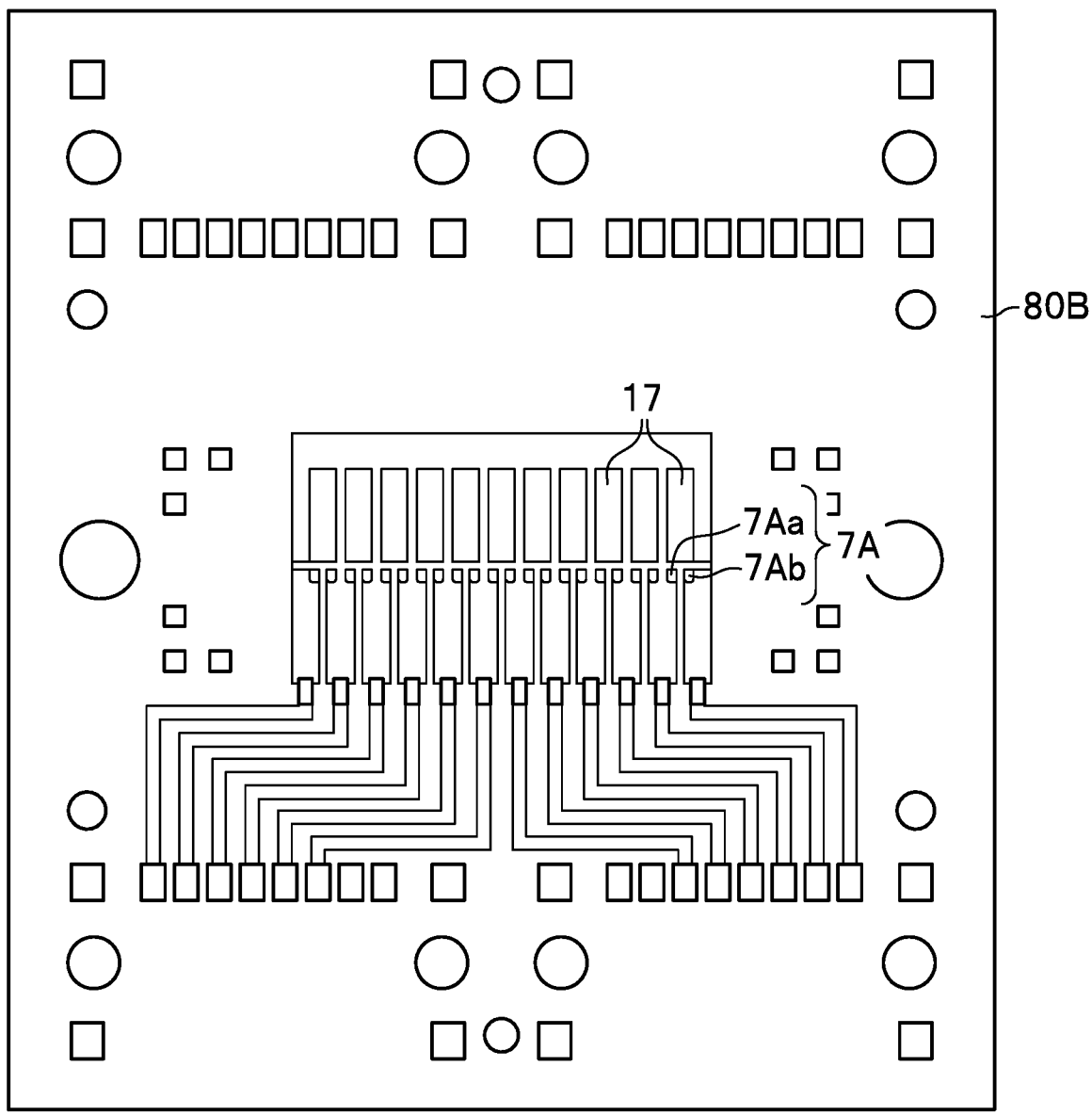
FIG. 6D is a schematic top view illustrating an example of a module substrate used in the light emitting module according to the ninth modification.
Figure 6F:
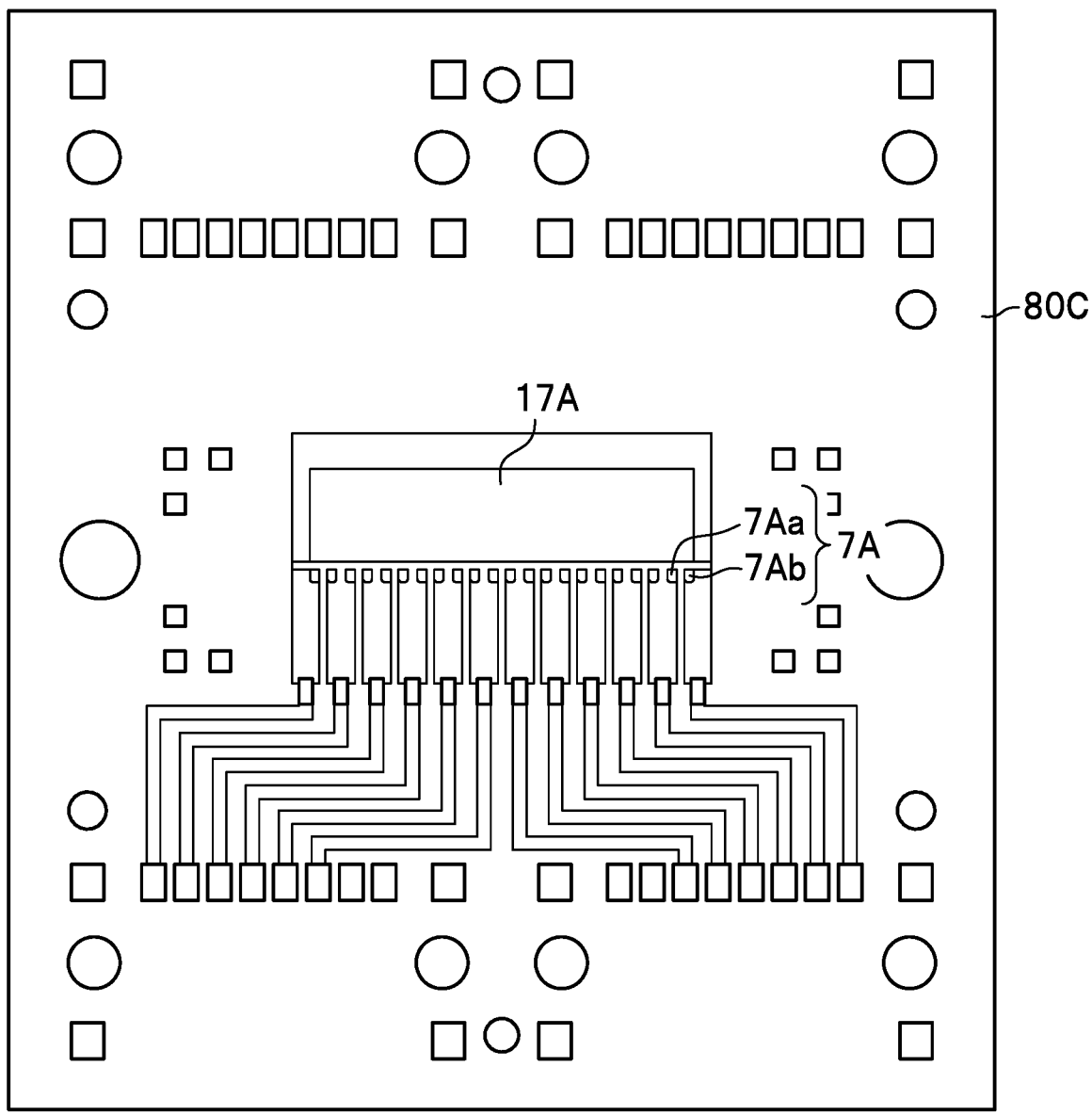
FIG. 6F is a schematic top view illustrating an example of a module substrate used in a light emitting module according to a tenth modification.
Figure 6G:
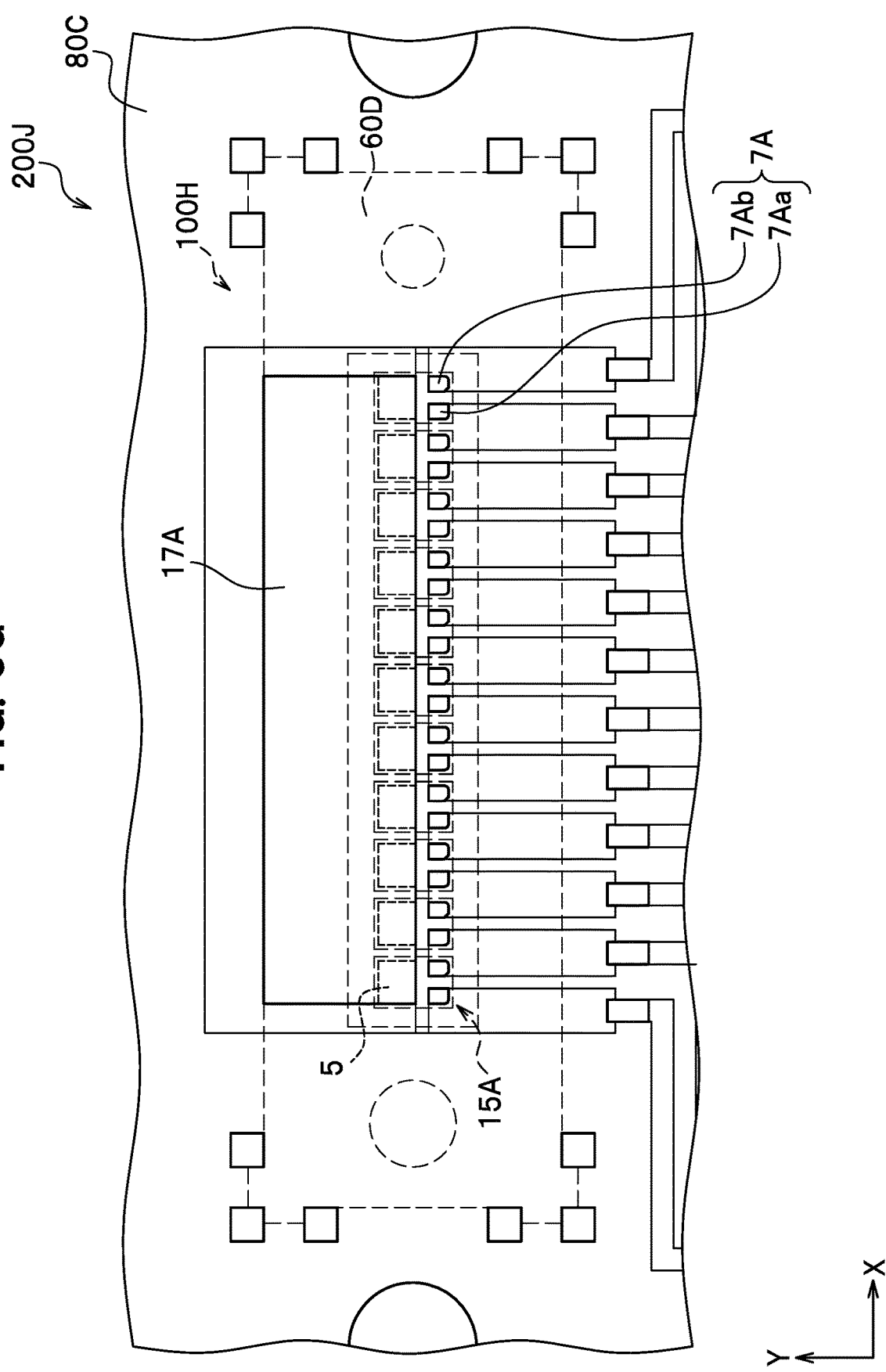
FIG. 6G is a schematic top view illustrating, in a partially expanded manner, an example of the light emitting module according to the tenth modification, and is a schematic top view illustrating a positional relationship between the module substrate of FIG. 6F and the light emitting device of FIG. 6A.

FIG. 6A is a schematic top view illustrating an example of a light emitting module including a light emitting device according to a ninth modification. FIG. 6B is a schematic bottom view illustrating an example of the light emitting device according to the ninth modification. FIG. 6C is a schematic cross-sectional view taken along line VIC-VIC of FIG. 6A. FIG. 6D is a schematic top view illustrating an example of a module substrate used in the light emitting module according to the ninth modification. FIG. 6E is a schematic top view illustrating, in a partially expanded manner, an example of the light emitting module according to the ninth modification, and is a schematic top view illustrating a positional relationship between the module substrate of FIG. 6D and the light emitting device of FIG. 6A. FIG. 6F is a schematic top view illustrating an example of a module substrate used in a light emitting module according to a tenth modification. FIG. 6G is a schematic top view illustrating, in a partially expanded manner, an example of the light emitting module according to the tenth modification, and is a schematic top view illustrating a positional relationship between the module substrate of FIG. 6F and the light emitting device of FIG. 6A. FIGS. 6E and 6G illustrate the light emitting device in a see-through manner.

In the ninth modification, a light emitting module 200I and a light emitting device 100H include heat dissipation terminals. In the light emitting device 100H, the substrate 10 provided in an element structural body 15A includes a first heat dissipation terminal 5, and a pair of external connection electrodes 3A on the bottom surface opposite to the top surface on which the light emitting element 20 is mounted. The substrate 10 has a substantially rectangular parallelepiped shape having a longitudinal direction and a lateral direction in a top view. The substrate 10 includes the pair of external connection electrodes 3A at a first end in the longitudinal direction of the bottom surface and the first heat dissipation terminal 5 at a second end opposite to the first end. The first heat dissipation terminal 5 faces positive and negative external connection electrodes (that is, an anode electrode 3Aa and a cathode electrode 3Ab) in the longitudinal direction. Thus, the light emitting device 100H includes the pair of external connection electrodes 3A having a shorter length in the longitudinal direction of the substrate 10, than the external connection electrode 3 of the light emitting device 100.

The first heat dissipation terminal 5 having a substantially rectangular shape is disposed on the bottom surface of the substrate 10. In the element structural body 15A, the first heat dissipation terminal 5 is disposed immediately beneath the light emitting element 20.

Examples of a material of the first heat dissipation terminal 5 include the examples described with respect to the material employed for the external connection electrode 3. The first heat dissipation terminal 5 is electrically insulated from the pair of external connection electrodes 3A. That is, the first heat dissipation terminal 5 and the light emitting element 20 are electrically insulated.

The light emitting device 100H differs from the light emitting device 100 in a size of an opening 63a of a support member 60D.

The light emitting device 100H is similar to the light emitting device 100 in other aspects.

The top surface of the module substrate 80B on which the light emitting device 100H is mounted includes positive and negative wiring parts 7A disposed at positions facing positive and negative external connection electrodes 3A, and a second heat dissipation terminals 17 disposed at position facing the first heat dissipation terminals 5.

In the module substrate 80B, a shape and a position of each of the wiring parts 7A joined to the light emitting device 100H match a shape and a position of each of the pair of external connection electrodes 3A. Specifically, the module substrate 80B includes the wiring parts 7A each having a shape substantially matching shapes of the anode electrode 3Aa and the cathode electrode 3Ab of the light emitting device 100H (an anode electrode-side wiring part 7Aa and a cathode electrode-side wiring part 7Ab).

The module substrate 80B includes the second heat dissipation terminals 17 disposed to respectively face the first heat dissipation terminals 5 of the element structural bodies 15A. The second heat dissipation terminals 17 are disposed continuously in a top view from a position facing the first heat dissipation terminal 5 to a position facing the bottom surface of the support member 60 in a Y direction perpendicular to the one direction X. As a result, heat dissipation can be further improved.

In the tenth modification, in a light emitting module 200J, the second heat dissipation terminal of a module substrate 80C differs in shape from the module substrate 80B.

The module substrate 80C on which the light emitting device 100H is mounted is provided with one second heat dissipation terminal 17A having a size including a plurality of regions facing the first heat dissipation terminal 5 of each of the plurality of element structural bodies 15A. That is, the module substrate 80C includes one second heat dissipation terminal 17A collectively connected with a plurality of the first heat dissipation terminals 5 provided in the light emitting device 100H. The second heat dissipation terminal 17A is disposed continuously in a top view from a position facing the first heat dissipation terminals 5 to a position facing the bottom surface of the support member 60D in a Y direction perpendicular to the one direction X. As a result, heat dissipation can be further improved.

The module substrate 80C is similar to the module substrate 80B in other aspects.

In the module substrate 80B and the module substrate 80C, the second heat dissipation terminals 17 and 17A are different in shape and position from the first heat dissipation terminal 5, but a module substrate in which the second heat dissipation terminals 17 and 17A match in shape and position with the first heat dissipation terminal 5 can be used.

Figure 7A:
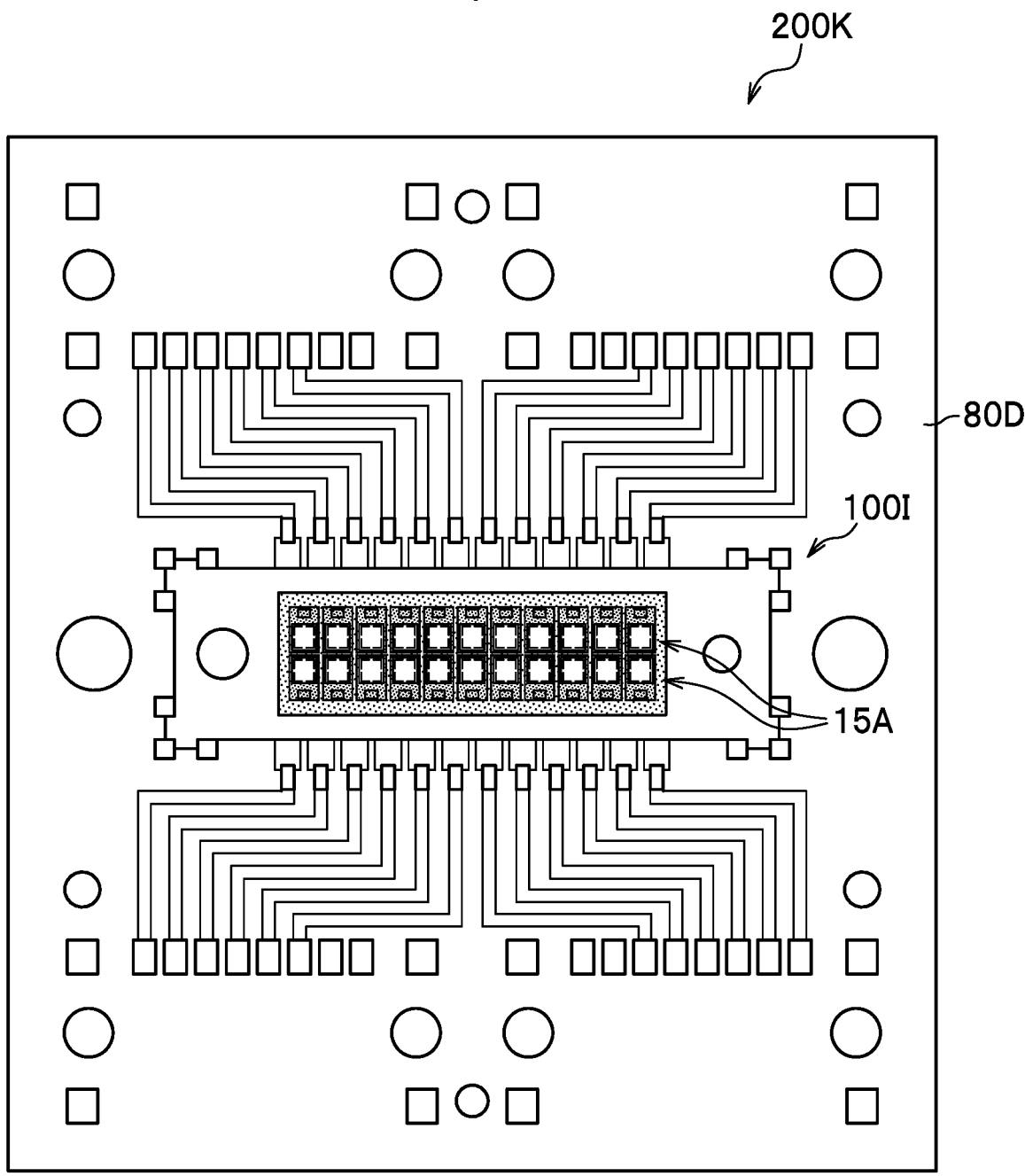
FIG. 7A is a schematic top view illustrating an example of a light emitting module including a light emitting device according to an eleventh modification.
Figure 7B:
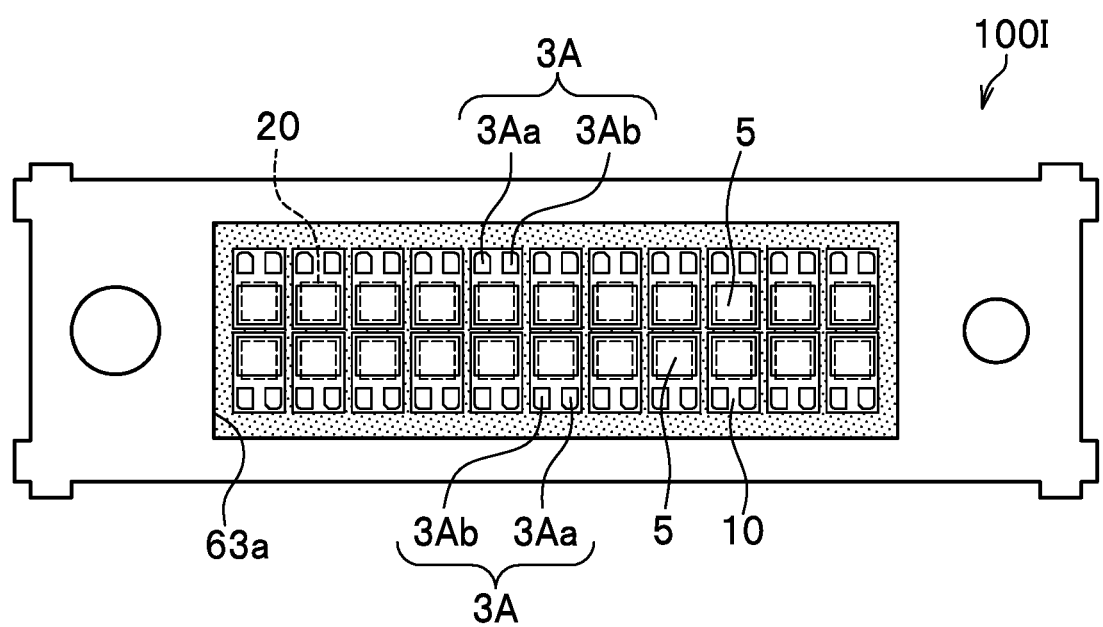
FIG. 7B is a schematic bottom view illustrating an example of the light emitting device according to the eleventh modification.
Figure 7C:
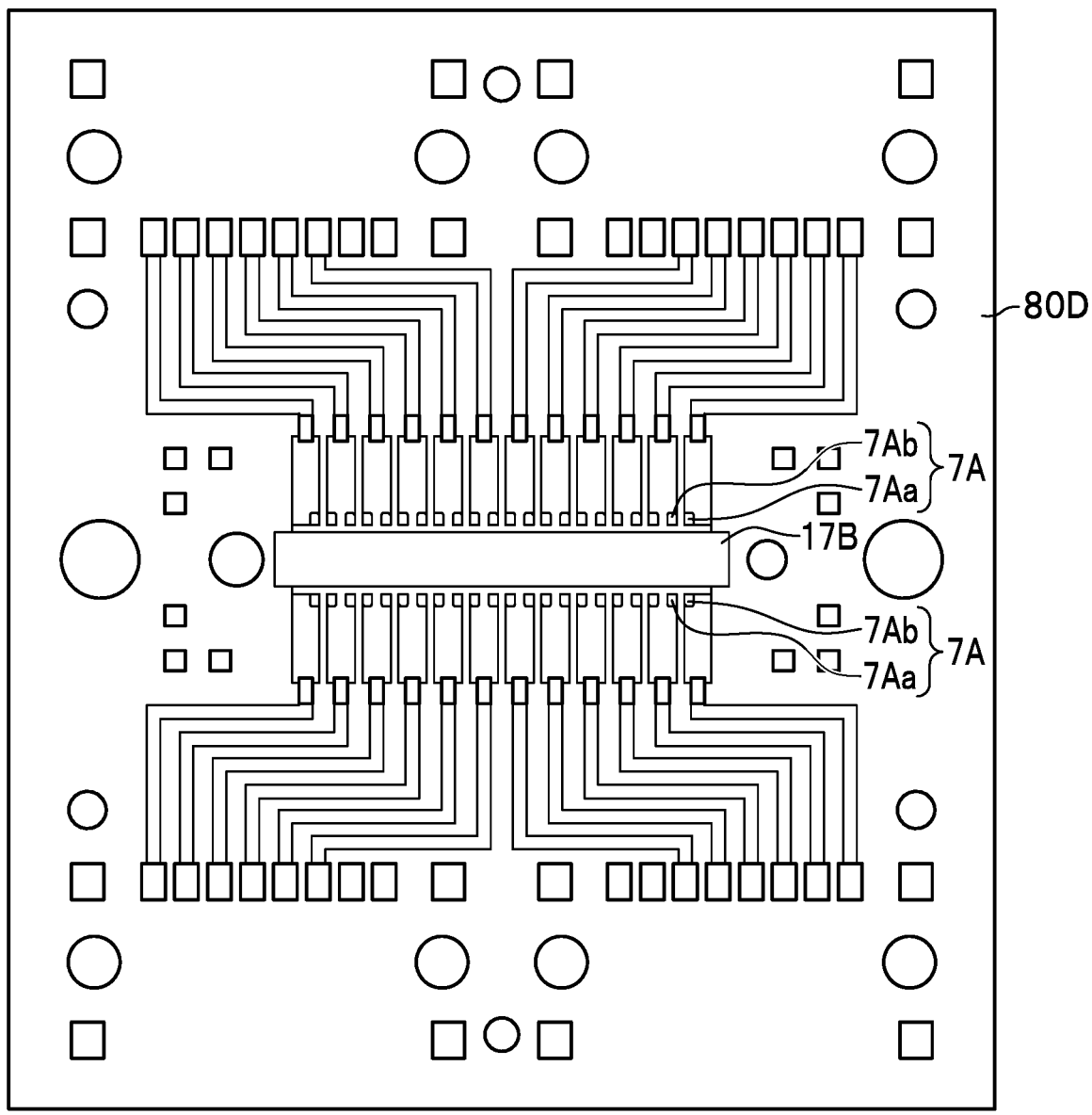
FIG. 7C is a schematic top view illustrating an example of a module substrate used in the light emitting module according to the eleventh modification.
Figure 7D:
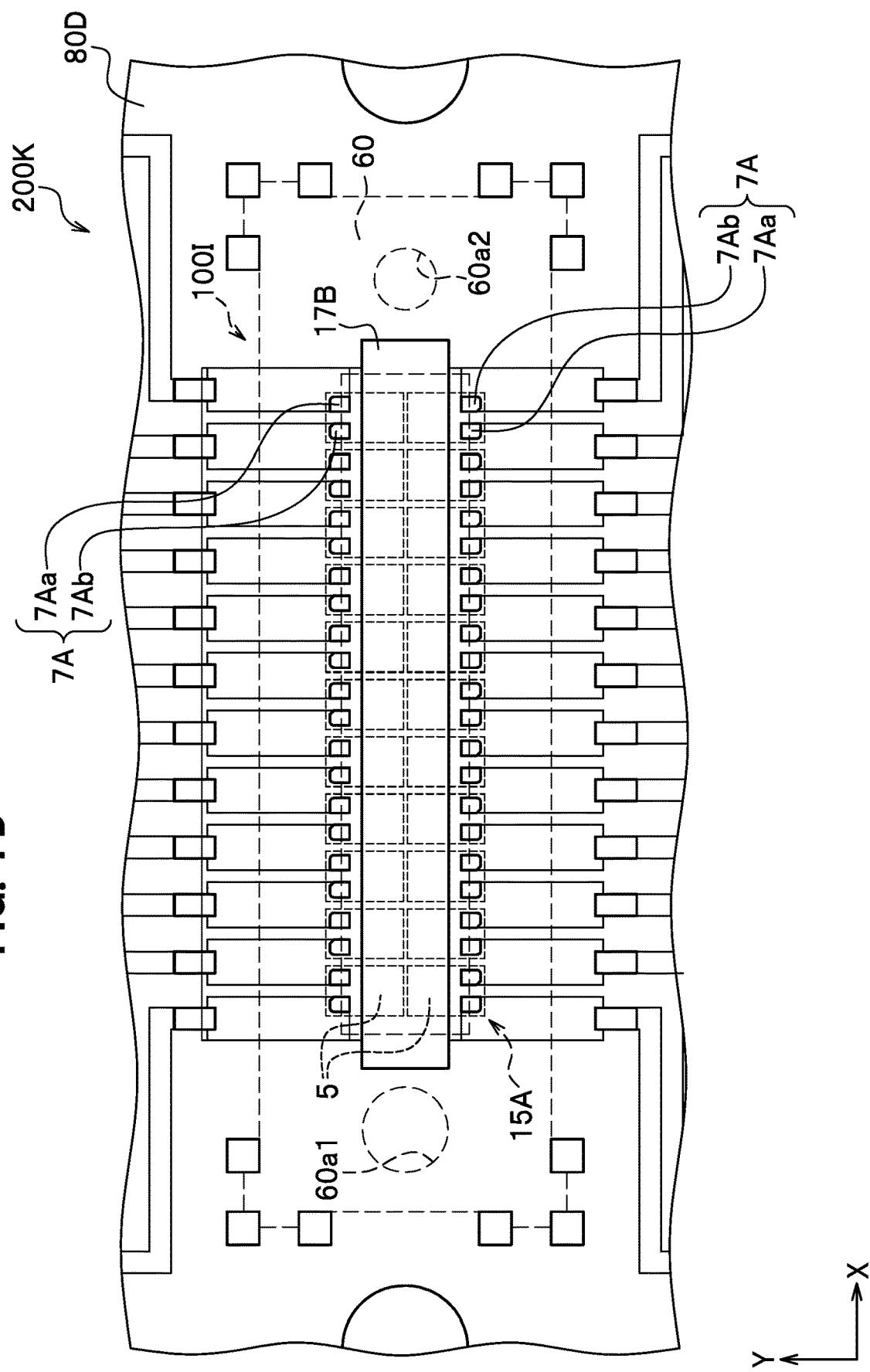
FIG. 7D is a schematic top view illustrating, in a partially expanded manner, an example of the light emitting module according to the eleventh modification, and is a schematic top view illustrating a positional relationship between the module substrate of FIG. 7C and the light emitting device of FIG. 7A.
Figure 7E:
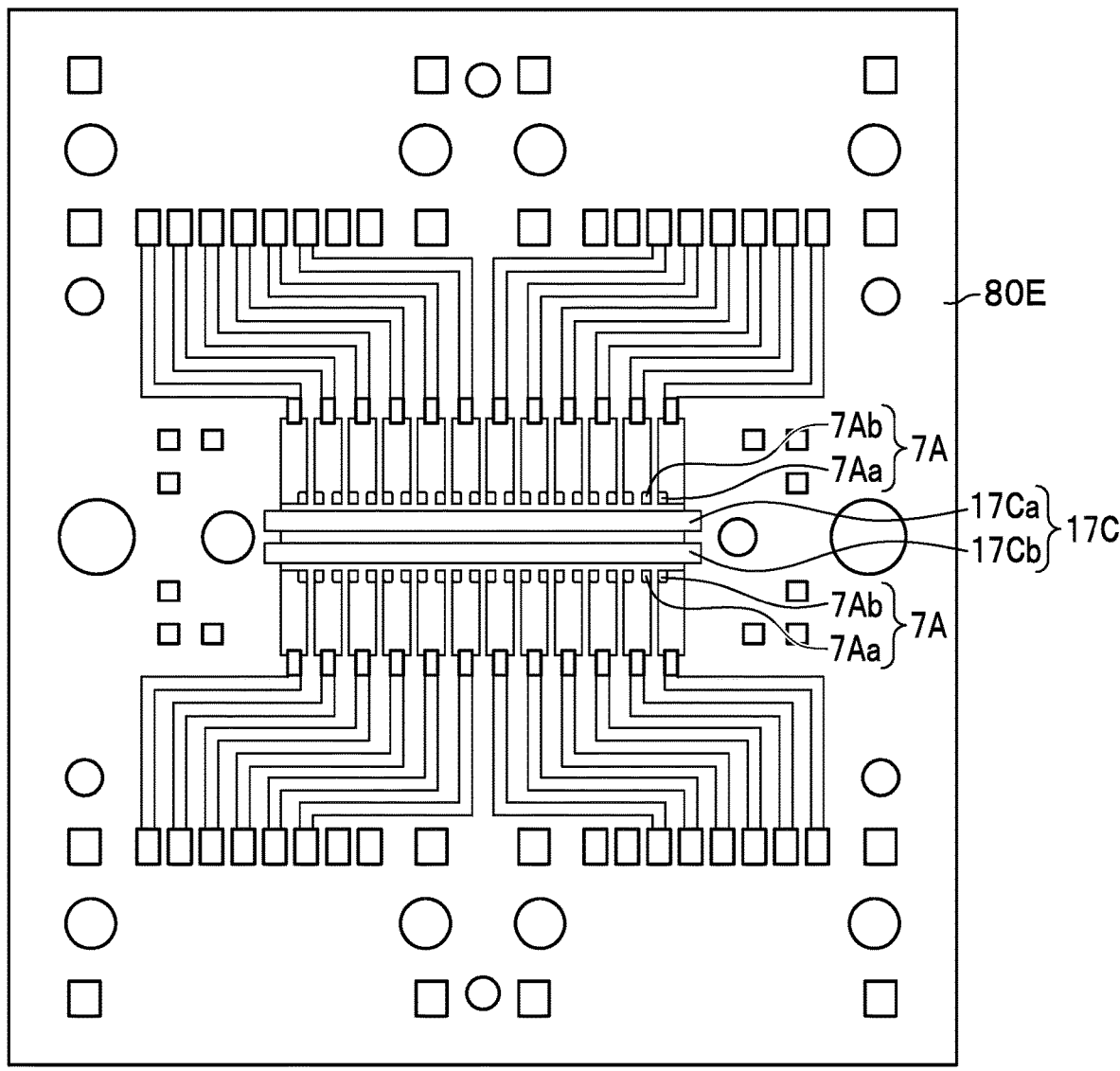
FIG. 7E is a schematic top view illustrating an example of a module substrate used in a light emitting module according to a twelfth modification.
Figure 7F:
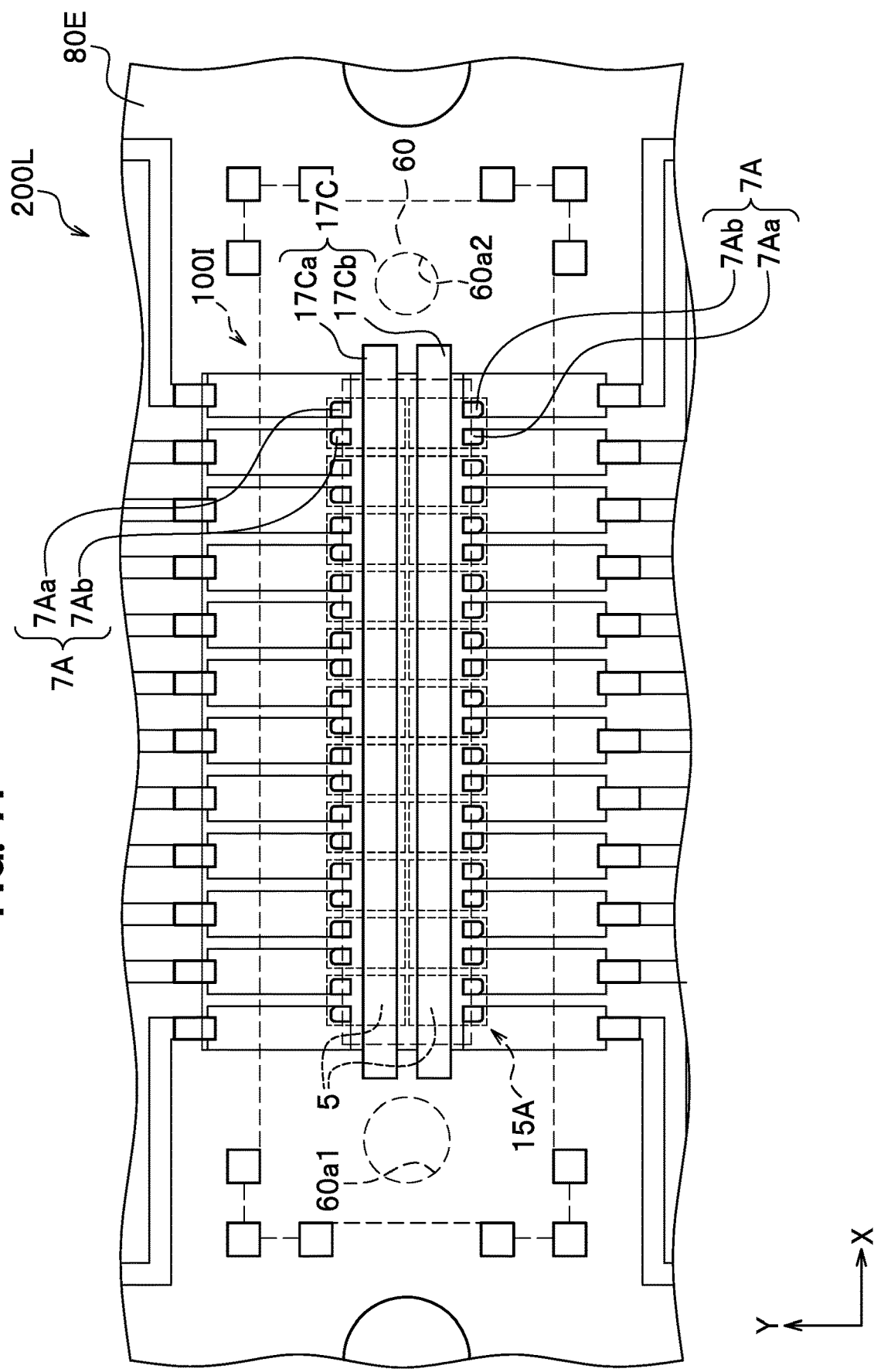
FIG. 7F is a schematic top view illustrating, in a partially expanded manner, an example of the light emitting module according to the twelfth modification, and is a schematic top view illustrating a positional relationship between the module substrate of FIG. 7E and the light emitting device of FIG. 7A.

FIG. 7A is a schematic top view illustrating an example of a light emitting module including a light emitting device according to an eleventh modification. FIG. 7B is a schematic bottom view illustrating an example of the light emitting device according to the eleventh modification. FIG. 7C is a schematic top view illustrating an example of a module substrate used in the light emitting module according to the eleventh modification. FIG. 7D is a schematic top view illustrating, in a partially expanded manner, an example of the light emitting module according to the eleventh modification, and is a schematic top view illustrating a positional relationship between the module substrate of FIG. 7C and the light emitting device of FIG. 7A. FIG. 7E is a schematic top view illustrating an example of a module substrate used in a light emitting module according to a twelfth modification. FIG. 7F is a schematic top view illustrating, in a partially expanded manner, an example of the light emitting module according to the twelfth modification, and is a schematic top view illustrating a positional relationship between the module substrate of FIG. 7E and the light emitting device of FIG. 7A. FIGS. 7D and 7F each illustrate the light emitting device in a transparent manner.

In the eleventh modification, in a light emitting module 200K and a light emitting device 100I, the plurality of element structural bodies 15A are disposed in a matrix of 2 rows and 11 columns along the one direction X. The plurality of element structural bodies 15A are disposed in two rows and linearly symmetrical with respect to a symmetry axis of a straight line parallel to the one direction X. That is, the plurality of element structural bodies 15A are disposed in two rows along the one direction X and are disposed so as to be linearly symmetrical with respect to the straight line passing between the two rows.

In the light emitting device 100I, in a top view, the element structural body 15A in the first row and the element structural body 15A in the second row are disposed so that the lateral surface(s) on the other end side where the first heat dissipation terminals 5 are disposed face each other. That is, the first heat dissipation terminals 5 included in the plurality of element structural bodies 15A are disposed inward of the pair of external connection electrodes 3A in a direction Y perpendicular to the one direction X in a top view.

The light emitting device 100I is similar to the light emitting device 100H in other aspects except for a size of the opening 63a of the support member.

The top surface of the module substrate 80D on which the light emitting device 100I is mounted includes positive and negative wiring parts 7A disposed at a position facing a positive and negative external connection electrodes 3A, and a second heat dissipation terminal 17B disposed at positions facing the first heat dissipation terminals 5.

The module substrate 80D includes one second heat dissipation terminal 17B having a size including a plurality of regions facing the first heat dissipation terminal 5 of each of the plurality of element structural bodies 15A.

In the module substrate 80D, the second heat dissipation terminal 17B is disposed continuously in a top view from a position facing at least one of the first heat dissipation terminals 5 to a position facing the bottom surface of the support member 60 in the one direction X. The second heat dissipation terminal 17B is positioned away from the through holes 60a1 and 60a2 in a top view.

That is, in the module substrate 80D, the plurality of first heat dissipation terminals 5 provided in the light emitting device 100I are collectively mounted, and the one second heat dissipation terminal 17B extends to a predetermined position facing the bottom surface of the support member 60 in the one direction X, in a top view. As a result, heat dissipation can be further improved.

The module substrate 80D is similar to the module substrate 80B in other aspects.

In the twelfth modification, in a light emitting module 200L, a second heat dissipation terminal of a module substrate 80E differs in shape from that of the module substrate 80D.

The module substrate 80E of the light emitting module 200L according to the twelfth modification is mounted thereon with the light emitting device 100I including the plurality of element structural bodies 15A disposed in a plurality of rows along the one direction X. The module substrate 80E includes a plurality of second heat dissipation terminals 17C corresponding to the plurality of rows in which the element structural bodies 15A are disposed. Each of the plurality of second heat dissipation terminals 17C is joined with the first heat dissipation terminals 5.

Specifically, the module substrate 80E includes, as the second heat dissipation terminals 17C, a second heat dissipation terminal 17Ca disposed to face the first heat dissipation terminal 5 of each of the element structural bodies 15A disposed in the first row, and a second heat dissipation terminal 17Cb disposed to face the first heat dissipation terminal 5 of each of the element structural bodies 15A disposed in the second row.

In addition, in the module substrate 80E, a pair of the second heat dissipation terminals 17C is disposed to extend to a position facing the bottom surface of the support member 60 in the one direction X, in a top view. As a result, heat dissipation can be further improved. The second heat dissipation terminal 17C is positioned away from the through holes 60a1 and 60a2 of the support member 60 in a top view.

The module substrate 80E is similar to the module substrate 80D in other aspects.

In the module substrate 80D and the module substrate 80E, the second heat dissipation terminals 17B and 17C are different in shape and position from the first heat dissipation terminal 5, but a module substrate in which the second heat dissipation terminals 17B and 17C match in shape and position with the first heat dissipation terminals 5 can be used.

Further, as long as the above-described steps are not adversely affected, the method of manufacturing the light emitting device and the method of manufacturing the light emitting module can include another step during, before, or after any of the steps.

Figure 8:
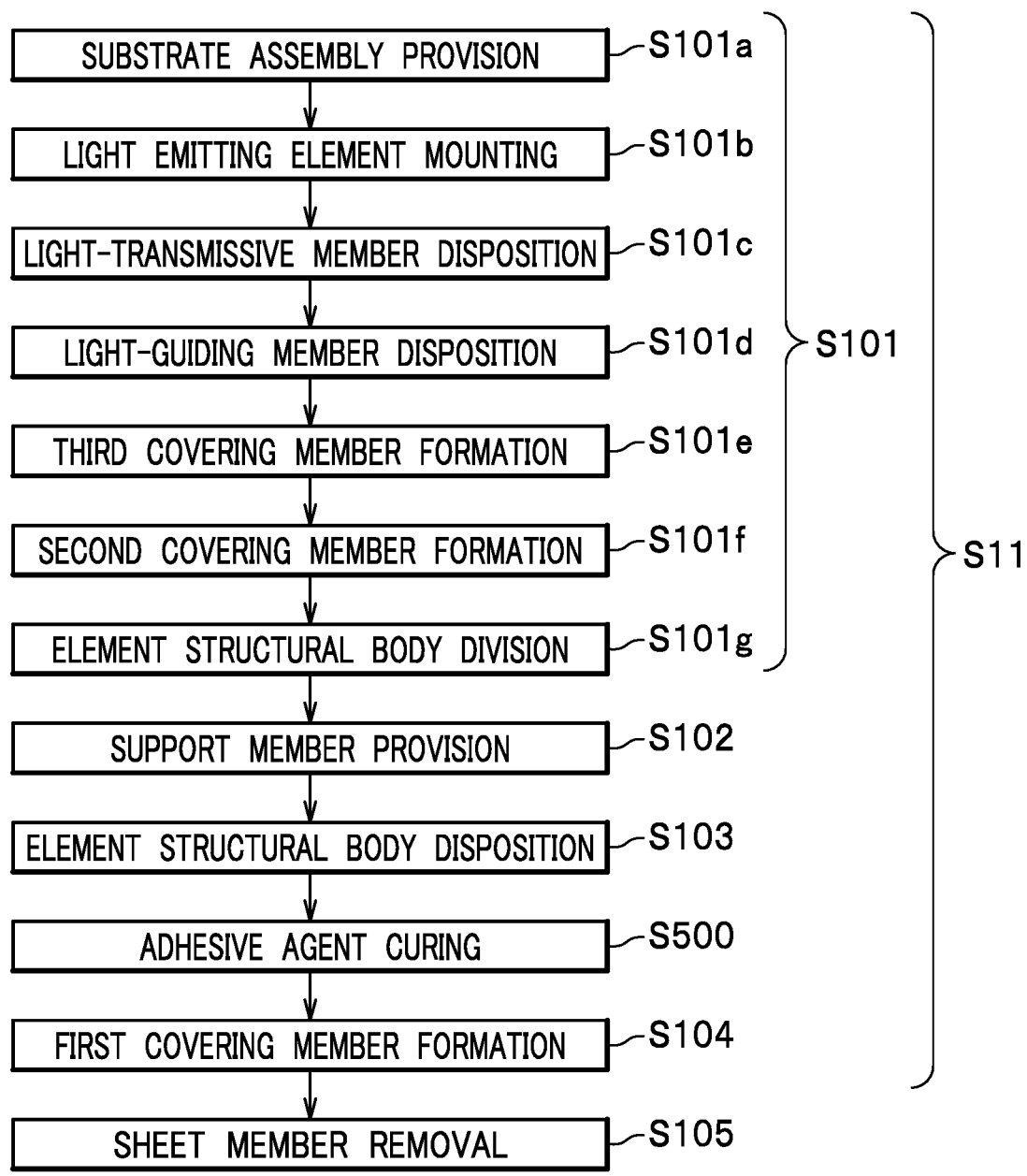
FIG. 8 is a flowchart of another method of manufacturing a light emitting device according to the embodiment.

FIG. 8 is a flowchart of another method of manufacturing a light emitting device according to the embodiment.

For example, in the method of manufacturing the light emitting device according to the embodiment, in a case in which a thermosetting resin is employed for the first covering member 51 in the first covering member formation step S104, an adhesive agent curing step S500, which is a step of curing an adhesive resin, that is, the adhesive agent 72, of the sheet member 70 can be performed after the element structural body disposition step S103 is performed, and before the first covering member formation step S104 is performed. Due to thermal history when the resin is cured and/or the time elapsed until the resin is cured, the light emitting device 100 may not easily be peeled from the sheet member 70 or a part of the adhesive agent 72 of the sheet member 70 may adhere to a rear surface of the light emitting device 100 after the peeling. In particular, in a case in which the element structural body 15 includes the external connection electrode 3 on the bottom surface of the substrate 10, once the adhesive agent 72 of the sheet member 70 adheres to the surface of the external connection electrode 3, an electrical connection may not be performed during mounting on the module substrate. To avoid this, when the adhesive agent 72 of the sheet member 70 is cured before the first covering member 51 is formed, the adhesive agent of the sheet member 70 is less likely to remained on the external connection electrode 3 of the light emitting device 100 after the sheet member 70 is removed. A curing condition and the like of the resin are ordinarily managed so that the above-described disadvantage do not occur, but the adhesive agent curing step S500 can be performed to further ensure suppression of adhesion and the like of the adhesive agent 72.

In addition, in the element structural body disposition step, the element structural body is disposed on the sheet member 70 so that the external connection electrode 3 is embedded in the adhesive agent 72 of the sheet member 70. However, the element structural body can be disposed on the sheet member 70 so that the external connection electrode 3 is not embedded in the adhesive agent 72 of the sheet member 70. In this case, in the first covering member formation step, the first covering member can cover the bottom surface of the substrate 10 and the lateral surface(s) of the external connection electrode 3.

For example, a step of removing a foreign matter mixed during manufacturing can be included.

Furthermore, in the method of manufacturing the light emitting device and the method of manufacturing the light emitting module, the order of some steps is not limited, and the order can be reversed. For example, in the element structural body provision step, after the plurality of light emitting elements 20 are mounted on the substrate 10, the light-transmissive member 30 is provided on each of the light emitting elements 20. However, after the light-transmissive member 30 is provided above the light emitting element 20, the light-transmissive member 30 can be mounted on the substrate 10. Furthermore, after the substrate assembly 11 is divided, the light emitting element 20 and the light-transmissive member 30 can be mounted on the substrate 10.

In addition, for example, in the method of manufacturing the light emitting device described above, the support member provision step is performed before the element structural body disposition step. However, the support member provision step can be performed before the first covering member formation step and after the element structural body disposition step. The support member provision step can be performed before the element structural body provision step.

The light emitting device and the light emitting module according to embodiments of the present disclosure can be suitably utilized for an adoptive driving beam headlight light source serving as a vehicle lighting appliance. In addition, the light emitting device and the light emitting module according to embodiments of the present disclosure can be utilized for a backlight light source of a liquid crystal display, various types of lighting fixtures, a large display, various types of display devices for advertisements, destination information, or the like, and further, a digital video camera, an image reading device in a facsimile, a copy machine, a scanner, and the like, and a projector device.

The invention claimed is:

1. A light emitting device, comprising:
a plurality of element structural bodies, each comprising:
a substrate,
a light emitting element mounted on or above the substrate, and
a light-transmissive member disposed on or above the light emitting element,
wherein at least three of the plurality of element structural bodies are disposed along a first direction;
a first covering member that covers lateral surfaces of the substrate, the light emitting element, and the light-transmissive member of each of the plurality of element structural bodies;
a support member that covers a lateral surface of the first covering member, wherein at least a portion of the support member is disposed lateral to the plurality of element structural bodies and extends along the first direction; and
an additional support member,
wherein the support member and the additional support member are disposed lateral to the plurality of element structural bodies and extend in the first direction along the plurality of element structural bodies such that the element structural bodies are interposed between the support member and the additional support member, and
wherein a rigidity of the support member is greater than a rigidity of the first covering member.

2. The light emitting device according to claim 1, wherein the support member is a frame surrounding the plurality of element structural bodies.

3. The light emitting device according to claim 1, wherein the support member is formed of a metal, an alloy, or an electrically insulating member.

4. The light emitting device according to claim 1, wherein a top surface of the support member is positioned lower than a top surface of the plurality of element structural bodies.

5. The light emitting device according to claim 1, wherein a width of a portion of the support member disposed lateral to the plurality of element structural bodies is in a range from 0.5 mm to 2.0 mm.

6. The light emitting device according to claim 1, wherein the plurality of element structural bodies are disposed in a plurality of rows along the first direction.

7. The light emitting device according to claim 1, wherein the first covering member is formed of a colored resin.

8. The light emitting device according to claim 1, wherein:
each of the plurality of element structural bodies includes a second covering member that covers a lateral surface of the light emitting element and a lateral surface of the light-transmissive member on the substrate, and
the first covering member covers the lateral surface of the light emitting element and the lateral surface of the light-transmissive member via the second covering member.

9. The light emitting device according to claim 1, wherein:
the support member includes two additional portions extending perpendicular to the first direction, and
the two additional portions each have a side extending perpendicular to the first direction, and each have a through hole at a position respectively corresponding to the side.

10. A method of manufacturing a light emitting module, comprising:
providing the light emitting device according to claim 9; and
mounting the light emitting device on a module substrate such that the substrates of the element structural bodies face the module substrate,
wherein the module substrate has holes at positions respectively facing through holes of the support member, and the mounting the light emitting device includes aligning positions of the through holes of the support member and of the holes of the module substrate to mount the light emitting device on the module substrate.

11. The light emitting device according to claim 1, wherein:
each substrate comprises:
a top surface wiring disposed on a top surface of the substrate on which the light emitting element is mounted,
an external connection electrode disposed on a bottom surface opposite to the top surface, and
a first heat dissipation terminal.

12. The light emitting device according to claim 11, wherein:
the plurality of element structural bodies are disposed in two rows so as to be linearly symmetrical with respect to a straight line parallel to the first direction, and
with respect to a straight line perpendicular to the first direction, the first heat dissipation terminal of each of the plurality of element structural bodies is disposed inward of the respective external connection electrode.

13. A light emitting module, comprising:
the light emitting device according to claim 12; and
a module substrate on which the light emitting device is mounted, with the module substrate facing the substrates of the element structural bodies, wherein the module substrate comprises:
- a plurality of wiring parts disposed on a top surface on which the light emitting device is mounted, at positions respectively facing a plurality of the external connection electrodes, and
- a second heat dissipation terminal disposed at a position facing a plurality of the first heat dissipation terminals.

14. A light emitting module, comprising:

the light emitting device according to claim 11; and a module substrate on which the light emitting device is mounted, with the module substrate facing the substrates of the element structural bodies, wherein the module substrate comprises:
- a plurality of wiring parts disposed on a top surface of the module substrate on which the light emitting device is mounted, at positions respectively facing a plurality of the external connection electrodes, and
- a plurality of second heat dissipation terminals disposed at positions respectively facing a plurality of the first heat dissipation terminals, wherein the plurality of second heat dissipation terminals extend from a position facing the plurality of first heat dissipation terminals to a position facing the support member in a direction perpendicular to the first direction.

15. A light emitting module, comprising:

the light emitting device according to claim 11; and a module substrate on which the light emitting device is mounted, with the module substrate facing the substrates of the element structural bodies, wherein the module substrate comprises:
- a plurality of wiring parts disposed on a top surface on which the light emitting device is mounted, at positions respectively facing a plurality of the external connection electrodes, and
- a second heat dissipation terminal disposed at a position facing a plurality of the first heat dissipation terminals.

16. A light emitting module, comprising:

the light emitting device according to claim 1; and a module substrate on which the light emitting device is mounted, with the module substrate facing the substrate of the light emitting device.

17. A light emitting device, comprising:

a plurality of element structural bodies, each comprising:
- a substrate,
- a light emitting element mounted on or above the substrate, and
- a light-transmissive member disposed on or above the light emitting element, wherein at least three of the plurality of element structural bodies are disposed along a first direction;

a first covering member that covers lateral surfaces of the substrate, the light emitting element, and the light-transmissive member of each of the plurality of element structural bodies; and a support member that covers a lateral surface of the first covering member, wherein at least a portion of the support member is disposed lateral to the plurality of element structural bodies and extends along the first direction, wherein a rigidity of the support member is greater than a rigidity of the first covering member, and wherein a top surface of the support member is positioned lower than a top surface of the plurality of element structural bodies.

18. A light emitting device, comprising:

a plurality of element structural bodies, each comprising:
- a substrate,
- a light emitting element mounted on or above the substrate, and
- a light-transmissive member disposed on or above the light emitting element, wherein at least three of the plurality of element structural bodies are disposed along a first direction;

a first covering member that covers lateral surfaces of the substrate, the light emitting element, and the light-transmissive member of each of the plurality of element structural bodies; and a support member that covers a lateral surface of the first covering member, wherein at least a portion of the support member is disposed lateral to the plurality of element structural bodies and extends along the first direction, and wherein the support member includes two additional portions extending perpendicular to the first direction, wherein the two additional portions each have a side extending perpendicular to the first direction, and each have a through hole at a position respectively corresponding to the side, and wherein a rigidity of the support member is greater than a rigidity of the first covering member.

* * * * *